(12) United States Patent
Yasufuku et al.

(10) Patent No.: US 6,544,061 B1
(45) Date of Patent: Apr. 8, 2003

(54) CONNECTOR WITH SLIDE

(75) Inventors: Kaori Yasufuku, Yokohama (JP); Taiji Hosaka, Yokohama (JP); Masaaki Miyazawa, Kawasaki (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 0 days.

(21) Appl. No.: 09/690,470

(22) Filed: Oct. 18, 2000

(30) Foreign Application Priority Data

Oct. 18, 1999 (JP) .......................................... 11-295227

(51) Int. Cl.⁷ ............................................. H01R 13/62
(52) U.S. Cl. ...................... 439/310; 439/607; 439/928.1
(58) Field of Search ............................. 439/928.1, 364, 439/157, 310, 325, 159, 607; 361/685, 686, 683, 747, 759, 801

(56) References Cited

U.S. PATENT DOCUMENTS

| | | | |
|---|---|---|---|
| 5,110,301 A | | 5/1992 | Inoue et al. |
| 5,119,269 A | | 6/1992 | Nakayama |
| 5,147,213 A | | 9/1992 | Funk et al. |
| 5,325,263 A | * | 6/1994 | Singer et al. ............... 361/683 |
| 5,483,419 A | * | 1/1996 | Kaczeus, Sr. et al. ...... 361/685 |
| 5,595,492 A | | 1/1997 | Taguchi |
| 5,721,669 A | * | 2/1998 | Becker et al. ............... 361/685 |
| 5,722,843 A | | 3/1998 | Kerckhof et al. |
| 5,738,537 A | * | 4/1998 | Setoguchi et al. .......... 439/159 |
| 5,856,937 A | * | 1/1999 | Chu et al. ..................... 361/51 |
| 6,045,377 A | * | 4/2000 | Kajiura ....................... 439/159 |

FOREIGN PATENT DOCUMENTS

| | | | |
|---|---|---|---|
| DE | 93 14 935.2 | 4/1994 | |
| DE | 4307136 A1 | 9/1994 | |
| EP | 0 585 825 A1 | 3/1994 | |
| EP | 0595327 A2 | 5/1994 | |
| EP | 0702460 A2 | 3/1996 | |
| JP | 62015781 | * 1/1987 | ......... H01R/13/629 |
| JP | 5-211076 | 8/1993 | |
| JP | 6-60944 | 3/1994 | |
| JP | 7-122057 | 5/1995 | |
| JP | 8-102346 | 4/1996 | |
| JP | 08-241754 | 9/1996 | |
| JP | 8-250211 | 9/1996 | |

OTHER PUBLICATIONS

European Search Report and annex for Application No. EO 00 40 2864, 7 pages.

* cited by examiner

*Primary Examiner*—Gary Paumen
*Assistant Examiner*—James R. Harvey
(74) *Attorney, Agent, or Firm*—Connolly Bove Lodge & Hutz LLP; Larry J. Hume

(57) ABSTRACT

In an electrical connector of the present invention, a cover is mounted on a main body in such a manner as to be rotatable around a shaft and is rotatably connected with a slider at a position thereof shifted from the shaft. A connection object, e. g., memory module, is detachable supported by the slider. When the cover is rotated, the slider is moved reciprocally with respect to contacts arranged in the main body in association with the rotation of the cover, so that the memory module can be connected with the contacts. By virtue of this, the loading or unloading of the memory module can be simplified and also the connector or the memory module can be prevented from being damaged or deformed during the operation.

11 Claims, 26 Drawing Sheets

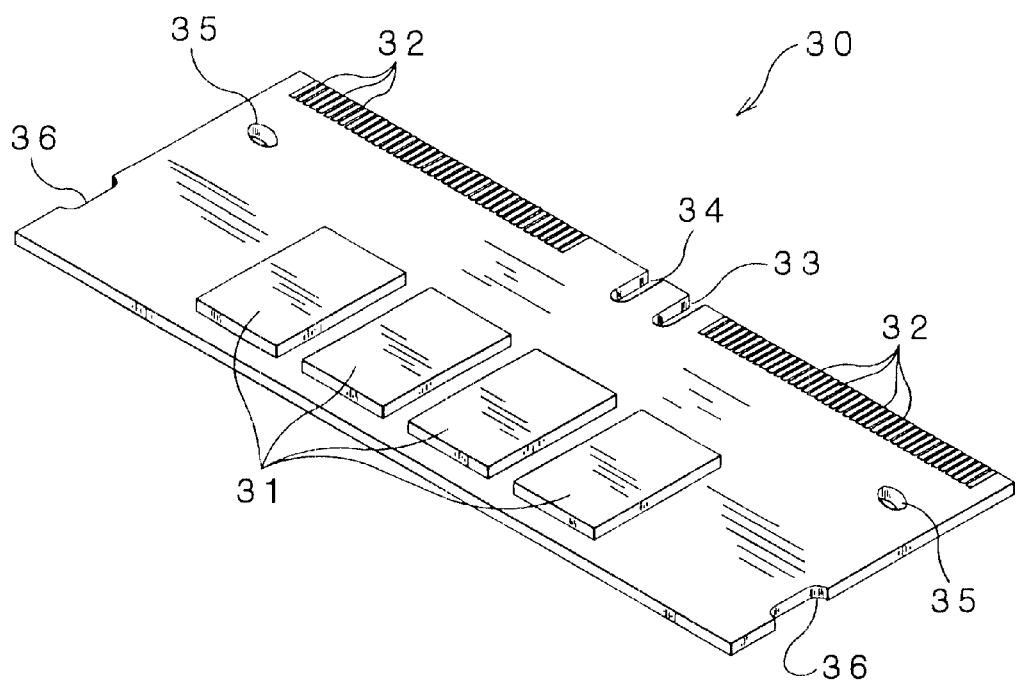
F I G. 3

F I G. 11
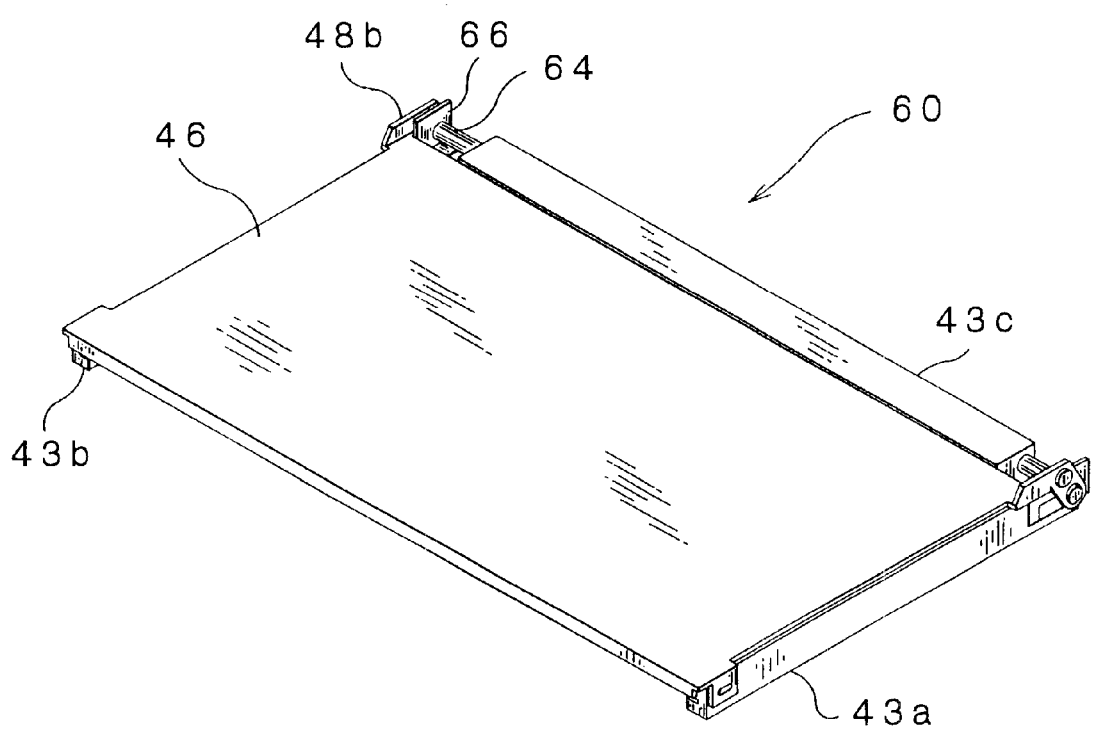

F I G. 14 (a)
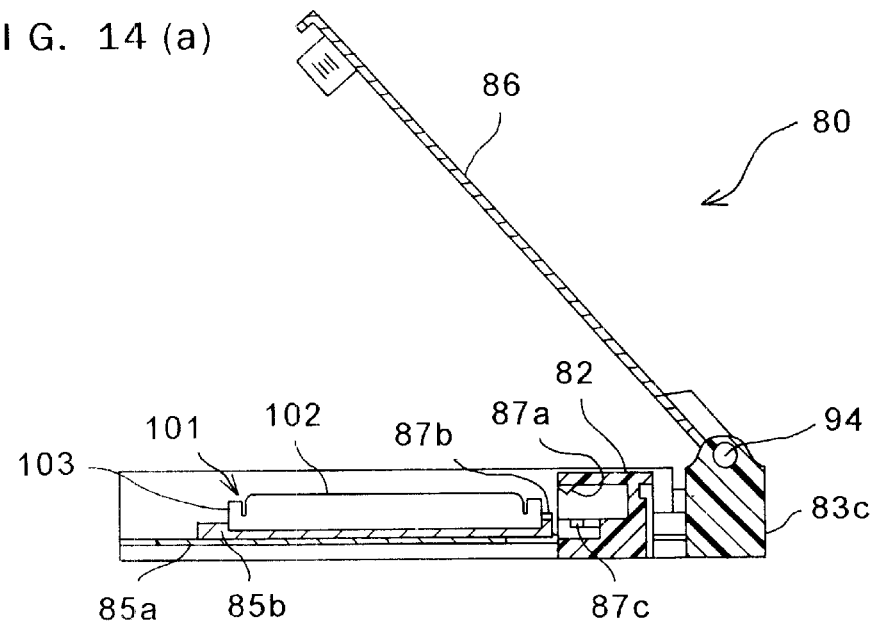
F I G. 14 (b)
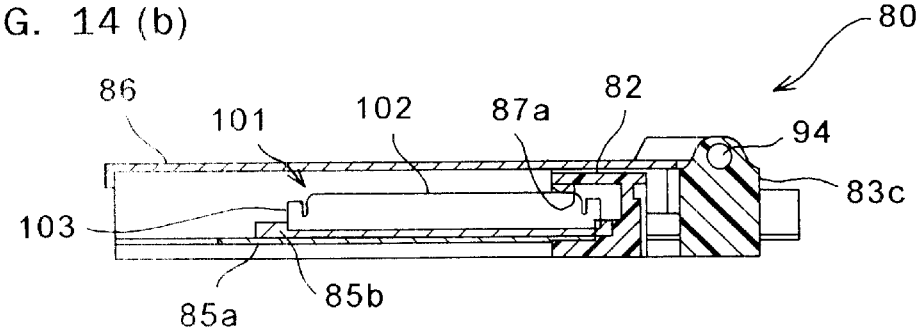
F I G. 15
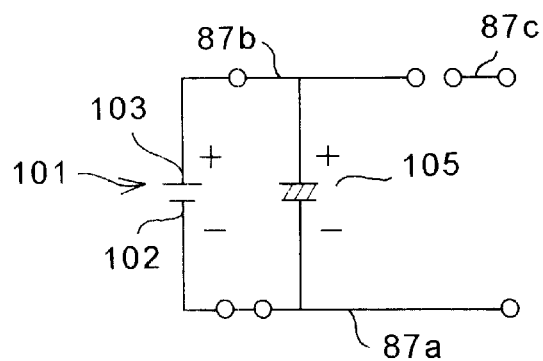

F I G. 21
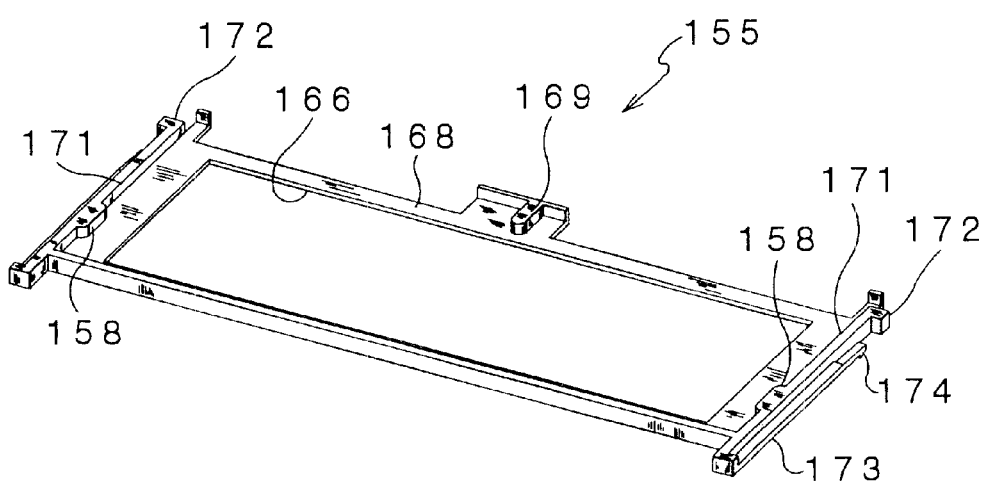

F I G. 22 (a)
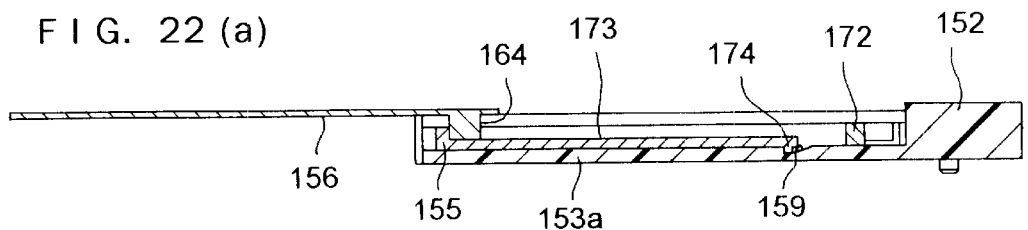
F I G. 22 (b)
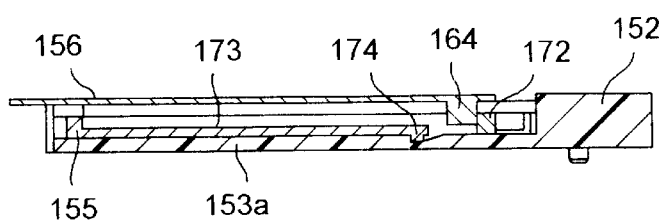
F I G. 22 (c)
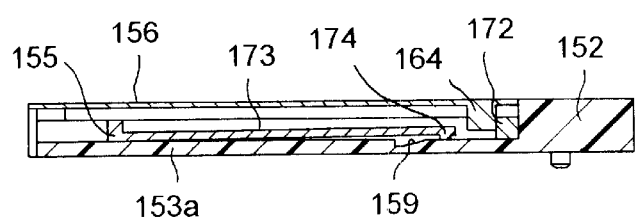
F I G. 22 (d)
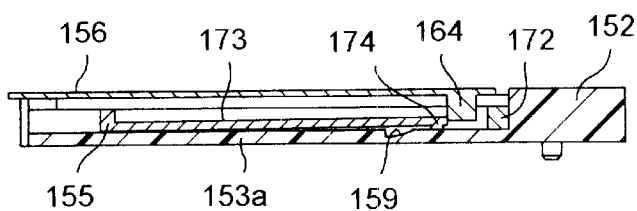
F I G. 22 (e)
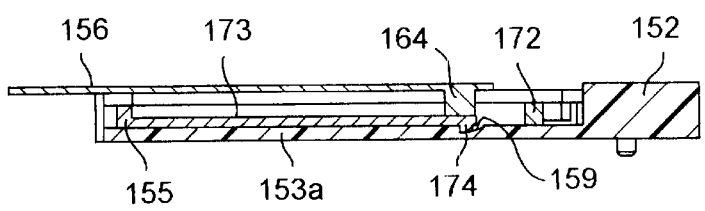

CONNECTOR WITH SLIDE

BACKGROUND OF THE INVENTION

1. Technical Field of the Invention

The present invention relates to a connector for electrically connecting a connection object, such as a memory module or a battery, to a terminal and, more particularly, to a connector of a simple structure for the connection object to be loaded in place with simple operation, for electrical connection with the terminal.

2. Description of the Prior Art

Of expansion memory module connectors of personal computers or the like, some are provided with latches for fixedly holding the memory module at end portions of two arms extending from opposite ends of its housing. The latches have protrusions to be engaged in cutouts provided at both sides of the memory modules and ears for the latches to be moved laterally outwardly.

When the memory module is loaded to the connector having these latches, the memory module is inserted in the connector at a predetermined angle until contacts on the connector and conductive pads on the memory module are brought into contact with each other and then the memory module is tilted down toward the connector. Then, the protrusions of the latches and the cutouts of the memory module are engaged with each other and thereby the memory module is fixed to the connector. When the memory module is released or unloaded from the connector, a user have to pull out the memory module from its loaded position, manipulating the ears to move the latches in a direction of being laterally spaced from each other.

Japanese Laid-open Patent Publication No. Hei 8(1996)-241754 describes a connector for a connection object, which takes the form of a card, to be inserted in a card holding frame of an open-close cover mounted on its base in an open and close relation. According to the connector of this type, the opening operation of the open-close cover induces the card to be ejected from the card holding frame of the open-close cover so as to permit simplification of the ejecting operation of the card.

When the memory module is loaded to the connector having the latches, the connector and the memory module are susceptible to damage or deformation by an excessive force locally exerted thereon. The same is caused when the memory module is unloaded from the connector as well. The unloading of the memory module from the connector, in particular, involves a troublesome work that the memory module is pulled out from its loaded position, while the ears are manipulated to move the latches in the direction of being laterally spaced from each other.

On the other hand, in the case of the connector disclosed in the abovementioned Japanese Laid-open Patent Publication No. Hei 8(1996)-241754, the loading of the card to the connector requires three steps that the card is inserted in the card holding frame of the open-close cover, first, and then is pressed in to a predetermined position and, thereafter, the open-close cover is closed, and thus is of troublesome. Also, since the card is ejected from the connector by means of elasticity of coil springs, a relatively large force must be applied to the card to press it in against the elasticity of the coil springs each time when the open-close cover is closed, and the loading work of the card is of further troublesome for the user. Further, at least two coil springs are required, resulting in complicated structure and increased manufacturing costs.

SUMMARY OF THE INVENTION

Accordingly, it is a primary object of the present invention to provide a connector which does not require any troublesome manipulation and does not cause damage or deformation of the connector and a connection object, such as a memory module, when the connection object is loaded and unloaded, and also is simple in structure.

According to one aspect of the invention, a connector for electrically connecting a connection object and a terminal is so constructed as to permit the connection object to be moved reciprocally relative to the terminal in association with movement of an operating member.

This produces the result that the connection object can be moved reciprocally relative to the terminal by operating the operating member by a user. This enables the connection object to be put into the state in which the connection object is not connected with the terminal as well as the state in which the connection object is connected with the terminal by operating the operating member. In other words, a selective switching between the connected mode and the non-connected mode of the connection object can be achieved by simply operating a single operating member that is preferably manually operated by a user. Also, there is no need for a user to directly touch the connection object when the connection object is put in its connected mode or its non-connected mode with the terminal, so that local application of an excessive force to the connection object or the connector is prevented and, thus, the damage or deformation of these components can be prevented.

Also, according to another aspect of the invention, a connector of the invention for electrically connecting a connection object and a terminal comprises a main body; a terminal, disposed in the main body, to be electrically connected with the connection object; an operating member arranged in association with the main body; and a supporting member that permits the connection object to be detachably supported and is movable reciprocally relative to the terminal in association with movement of the operating member.

This produces the result that all a user needs to do for the connection of the connection object to the terminal is that after the connection object is supported on the supporting member, the operating member is simply moved. Also, when the connection object is unloaded as well, all the user needs to do is to operate the operating member in the opposite direction until the disconnection between the connecting portion and the terminal and then remove the connection object from the supporting member.

Therefore, no such a troublesome work that the latches have to be opened out, and the loading and unloading of the connection object to and from the connector can be done through one-touch operation, thus producing very simplified operation. Also, no specific components are necessary for the operation, other than the main body, the operating member and the supporting member, so the mechanism is very simple.

It should be noted that according to the invention, the connection object which may includes electronic modules in which electronic chips are arranged in a card-like substrate, batteries (whichever their types, a dry battery, a button battery, etc.), fuses and various kinds of cards (CF (Compact Flash) card, MMC (Multimedia Card), smart media, SIM, and PCMCIA card). Any of them can be used as the connection object as long as it is electrically connectable with the terminal arranged at the connector side.

Other and further objects, features and advantages of the invention will appear more fully from the following description taken in connection with the accompanying drawings.

BRIEF DESCRIPTION OF THE DRAWINGS

FIG. 3 is a perspective view of the memory module for the notebook-size computer to be loaded to the connector of FIG. 1;

FIG. 6(*b*) is a side elevation view of the same, showing the state of the cover being closed;

FIG. 8(*b*) is a sectional view of the same, showing the state of the cover being closed;

FIG. 11 is a perspective view of the connector of FIG. 10, showing the state of the cover being closed;

FIG. 12(*b*) is a side elevation view of the same, showing the state of the cover being closed;

FIG. 14(*a*) is a sectional view of the connector of FIG. 13, showing the state of the cover being opened;

FIG. 14(*b*) is a sectional view of the same, showing the state of the cover being closed;

FIG. 15 is a circuit diagram of the connector and a button battery of FIG. 13 in the state of the cover being opened;

FIG. 21 is a perspective view of the slider used in the connector of FIG. 19;

FIGS. 22(*a*)–(*e*) are sectional views of the connector of FIG. 19, taken along an arm of the base;

DESCRIPTION OF THE PREFERRED EMBODIMENT

Figure 1:
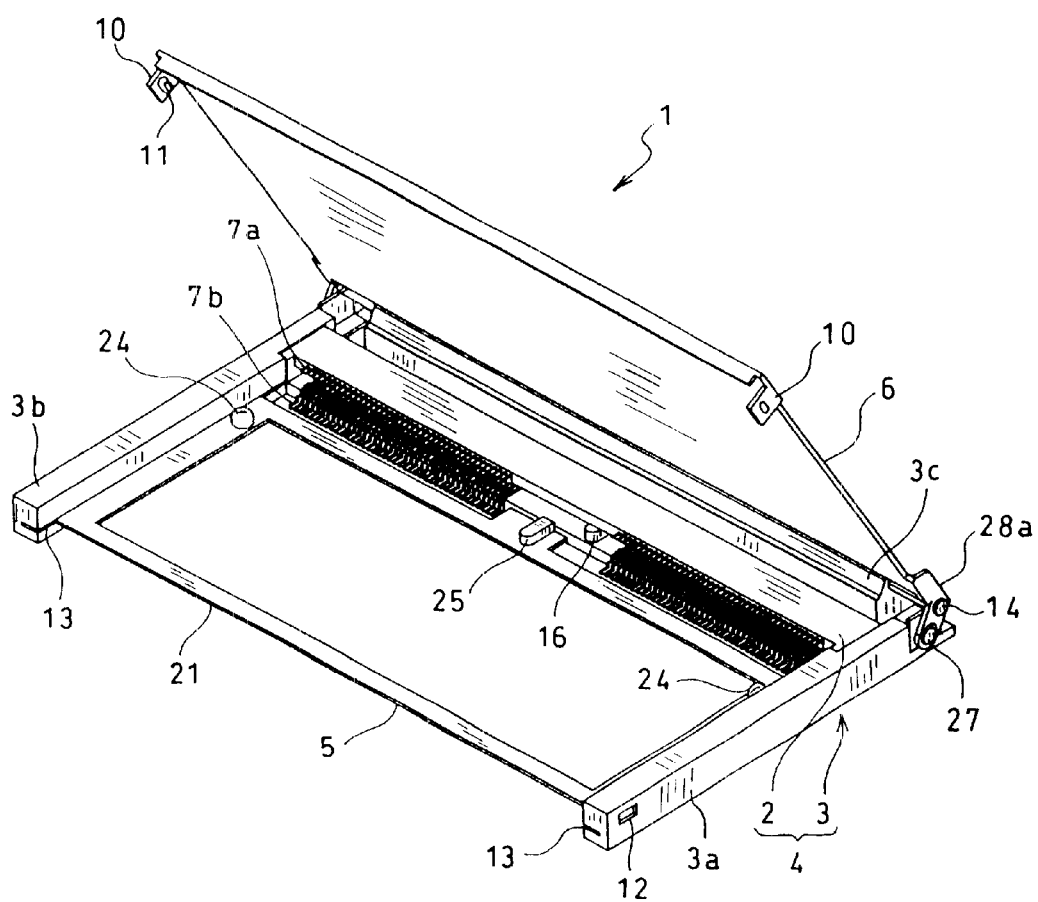
FIG. 1 is a perspective view of a connector according to the first embodiment of the invention which is to be loaded with a memory module for a notebook-size personal computer, showing the state of its cover being opened.
Figure 2:
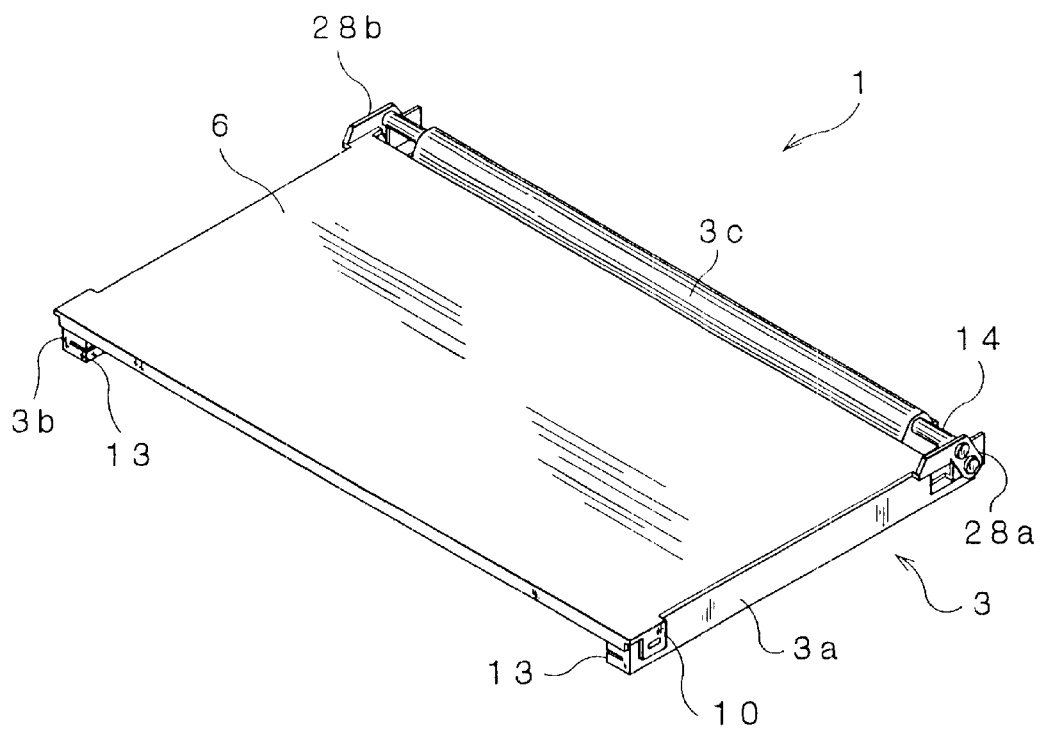
FIG. 2 is a perspective view of the connector of FIG. 1, showing the state of the cover being closed.

Referring to FIGS. 1 and 2, there are shown perspective views of a connector according to the first embodiment of the invention which is to be loaded with a memory module for a notebook-size personal computer, showing the state of the cover being opened and the state of the cover being closed, respectively. FIG. 3 is a perspective view of the memory module for the notebook-size personal computer to be loaded to the connector of this embodiment. The connector 1 of the embodied form shown in FIGS. 1 and 2 has a main body 4 comprising a housing 2 and a base 3, a slider 5 mounted on the base 3 in such a manner as to be reciprocally slidable away from and toward the housing 2, and a cover 6 rotatably mounted on the base 3.

A memory module 30 shown in FIG. 3 is of generally rectangular in plan configuration, and on both sides thereof a plurality of chips 31 including DRAM memory chips are mounted. The memory module has two key slots 33, 34 around a center part thereof on the front on the side on which it is inserted to the connector 1 and a large number of conductive pads 32 on front and back faces thereof at both lateral sides of the key slots. The key slot 33 is in the form of a recess having a semi-circular form at a tip end thereof. The key slot 34 has the same size and form as the key slot 33. At least either of the key slots 33, 34 is varied in position in accordance with types of the memory modules 30. Protrusions (keys 16, 25 mentioned later) to be fitted in the key slots 33, 34 are provided at the connector 1 to prevent the erroneous loading of a non-conforming type of memory module to the connector 1.

Two circular holes 35 are formed at positions near areas in which the conductive pads 32 are arranged. Cutouts 36 are provided at opposite ends of the memory module 30, respectively. The cutouts 36 are for permitting the memory module 30 to be loaded to the connector having the latches as discussed in the section of Description of the prior art.

Figure 4:
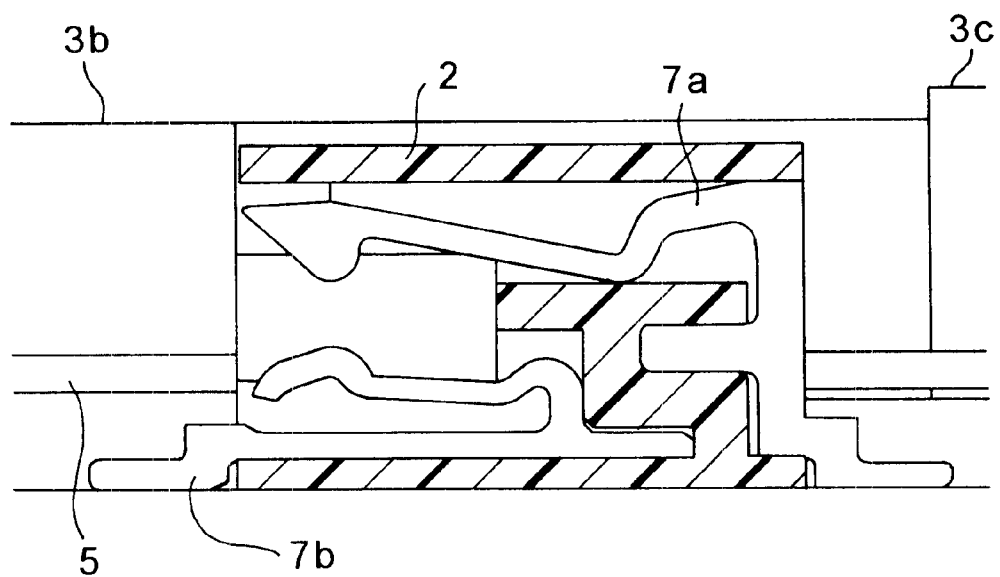
FIG. 4 is a sectional view of a portion of the connector of FIG. 1 near its housing.
Figure 5:
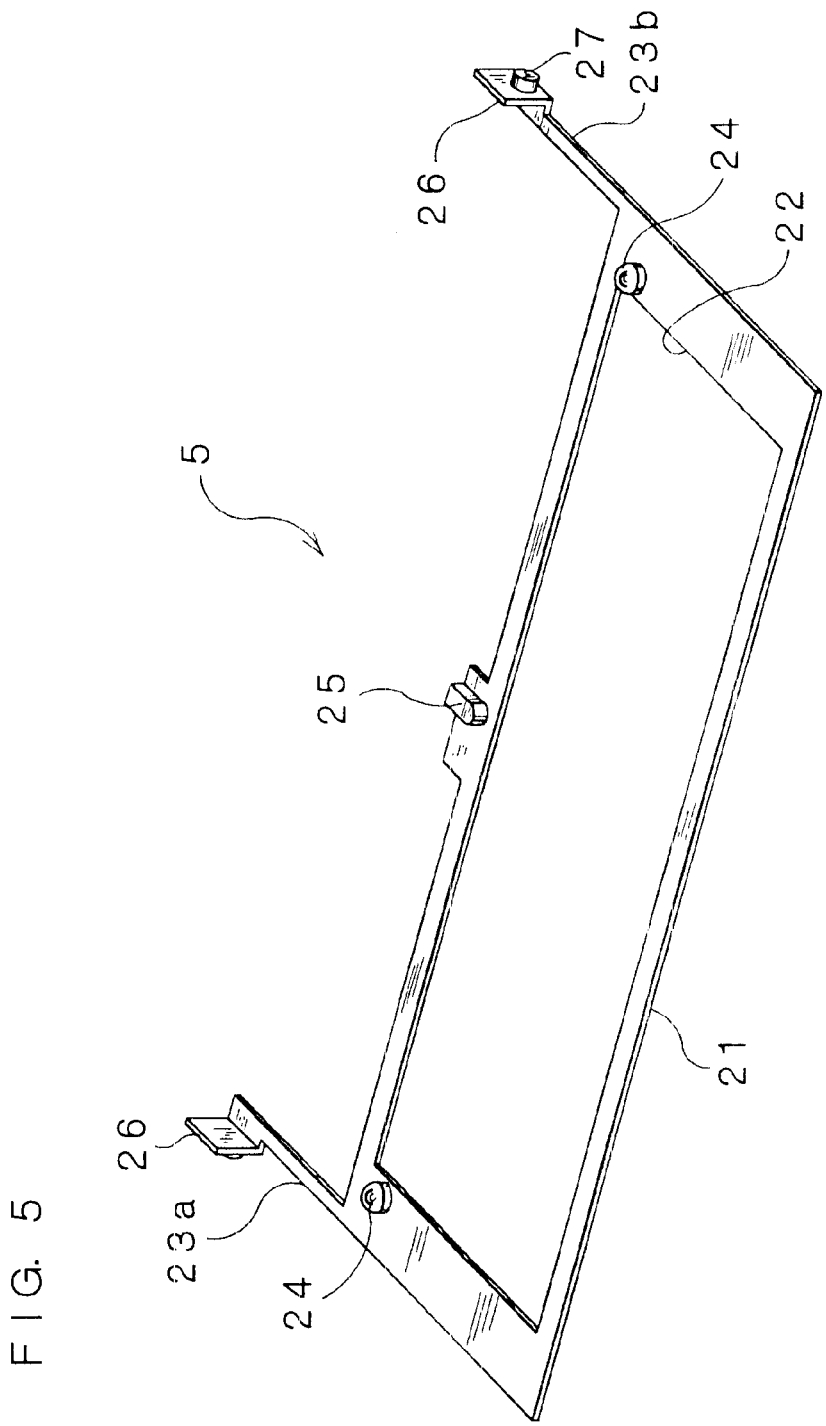
FIG. 5 is a perspective view of a slider used in the connector of FIG. 1.
Figure 6:
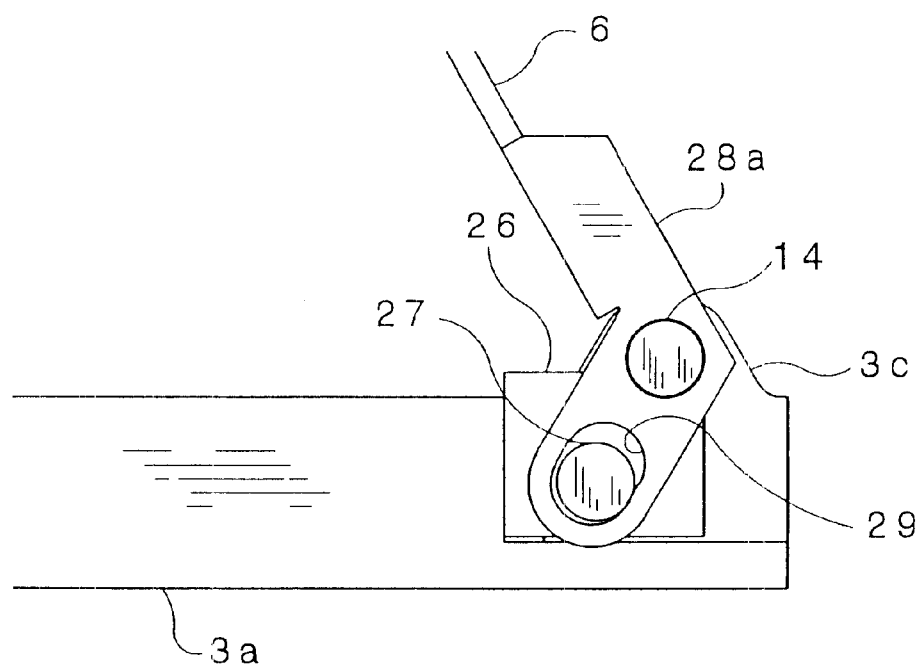
FIG. 6(*a*) is a side elevation view of a connecting portion of the connector of FIG. 1 at which the slider and the cover are connected together, showing the state of the cover being opened.
Figure 6:
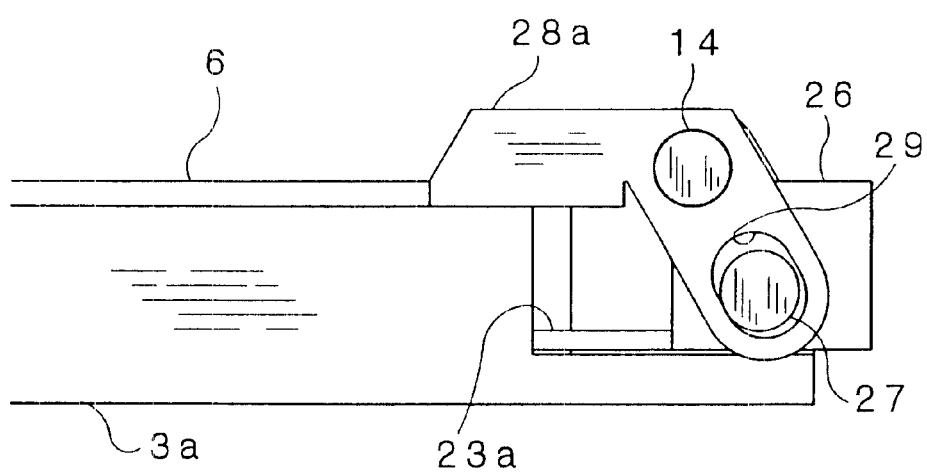

The structure of the connector 1 of this embodiment will be described with further reference to FIGS. 4–6. FIG. 4 is a sectional view of a portion of the connector near the housing. FIG. 5 is a perspective view of the slider. FIGS. 6 are side elevation views of a connecting portion at which the slider and the cover are connected together, FIG. 6(a) showing the state of the cover being opened and FIG. 6(b) showing the state of the cover being closed.

As shown in FIGS. 1 and 4, a large number of upper contacts 7a and lower contacts 7b made of metallic material are arranged at regular intervals in two separated areas of the housing 2 made of synthetic resin, respectively. The upper contacts 7a and the lower contacts 7b are electrically connected with the conductive pads 32 when the memory module 30 is loaded to the connector 1. A key 16 having a size and a configuration to be fitted in the key slot 33 is provided between the two areas, where the upper contacts 7a and the lower contacts 7b are arranged, at a position corresponding to the key slot 33 of the memory module 30.

The base 3 is composed of two spaced apart arms 3a, 3b and a connecting portion 3c connected with the two arms 3a, 3b at one end sides thereof. The arms 3a, 3b and the connecting portion 3c are both formed of synthetic resin. The housing 2 is connected with the two arms 3a, 3b at a position close to the connecting portion 3c. The arms 3a, 3b have recesses engageable with protrusions 11 mentioned later formed in their outside surfaces near the ends. The arms 3a, 3b have in their inside surfaces slots extending along the extending direction of the arms 3a, 3b. End portions of the slider 5 are inserted in the slots 13 so that the slider 5 can slide in the slots 13. A hole is formed in the connecting portion 3c of the base 3 near the upper end, extending along the extending direction, and a shaft 14 is inserted in the hole.

As shown in FIG. 5, the slider 5 is provided with a rectangular frame 21 formed to surround an opening 22 and arms 23a, 23b extending from opposite ends of the frame 21 in the widthwise direction. The frame 21 has two projections 24 formed at positions corresponding to the holes 35 formed in the memory module 30. The insertion of the projections 24 in the holes 35 permits the memory module 30 to be detachably supported to the slider 5. An upper surface of the frame 21 forms a bearing surface for the memory module 30. Also, the frame 21 has a key 25 of a size and configuration to fit in the key slot 34 formed at a position corresponding to the key slot 34 of the memory module 30. The arms 23a, 23b have bent portions 26 bent upwards at positions close to the ends and columnar protrusions 27 formed outside of the bent portions.

The cover 6 made of metallic material is formed to have a size to cover the whole area of the memory module 30 when the cover is closed, as shown in FIG. 1. The cover 6 is provided at both ends thereof with bent portions 10 bent toward the base 3, respectively. The bent portions 10 are provided at inside thereof with the protrusions 11 which are brought into engagement with the recesses 12 in the arms 3a, 3b of the base 3 when the cover 6 is closed.

As shown in FIGS. 2, 6(a), 6(b), the cover 6 has two bent arms 28a, 28b which are bent inwardly toward the ends at portions thereof opposite the bent portions 10 at the both ends of the cover 6. The bent arms 28a, 28b are rotatably connected with the shaft 14 at portions thereof close to the bent portions. Thus, the cover 6 can be allowed to rotate around the shaft 14 in both directions. The bent arms 28a, 28b have generally elliptical holes 29 formed near the ends thereof. The columnar protrusions 27 of the slider 5 are fitted in the holes 29 and thereby the slider 5 and the cover 6 are rotatably connected.

Thus, when the cover 6 is rotated around the shaft 14 from its opened state shown in FIG. 6(a) until its closed state shown in FIG. 6(b), the bent arms 28a, 28b at portions between the ends thereof and the shaft 14 move rightward in the drawing, in association with which the columnar protrusions 27 are moved vertically in reciprocation within the holes 29, while moving rightward in the drawing. As a result, the slider 5 is moved toward the upper and lower contacts 7a, 7b in the housing 2. When the cover 6 is rotated around the shaft 14 from its closed state shown in FIG. 6(b) until its opened state shown in FIG. 6(a), the bent arms 28a, 28b at portions between the ends thereof and the shaft 14 move leftward in the drawing, in association with which the slider 5 moves away from the upper and lower contacts 7a, 7b in the housing 2. In short, the slider 5 moves reciprocally with respect to the upper and lower contacts 7a, 7b in association with the rotation of the cover 6.

Figure 7:
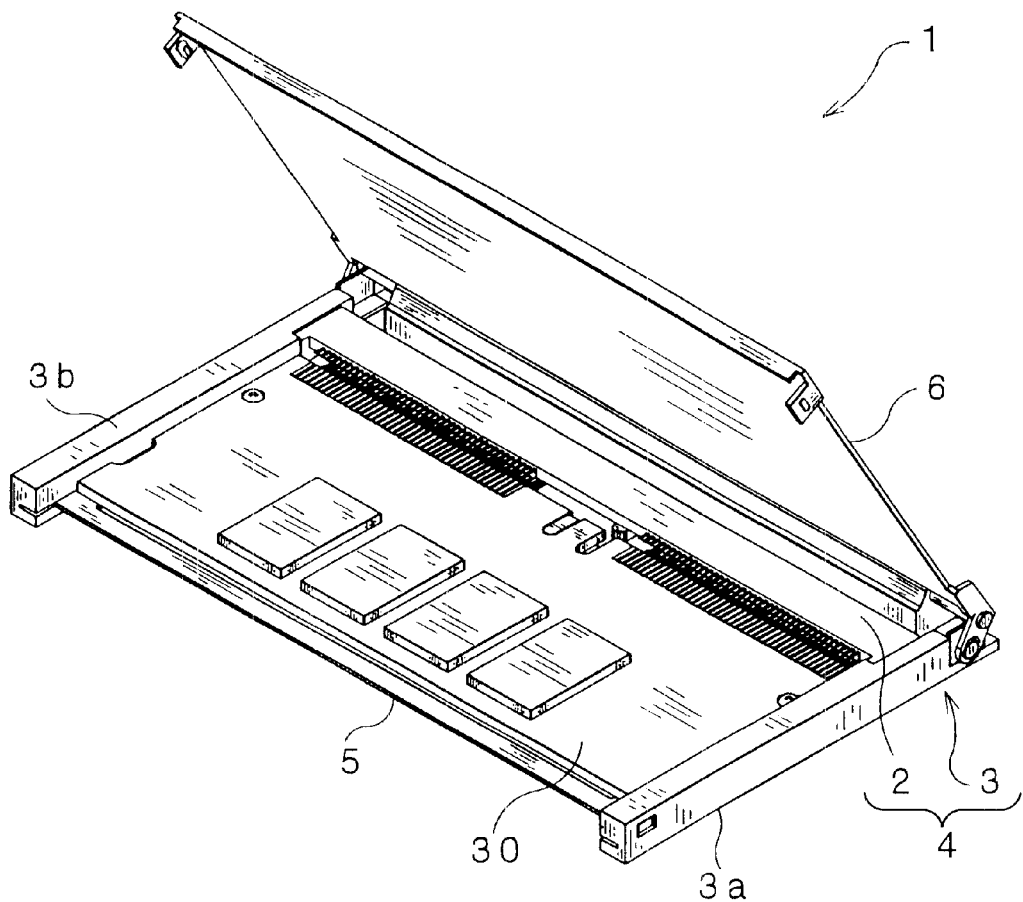
FIG. 7 is a perspective view of the connector of FIG. 1, showing the state in which the memory module is supported to the slider.
Figure 8:
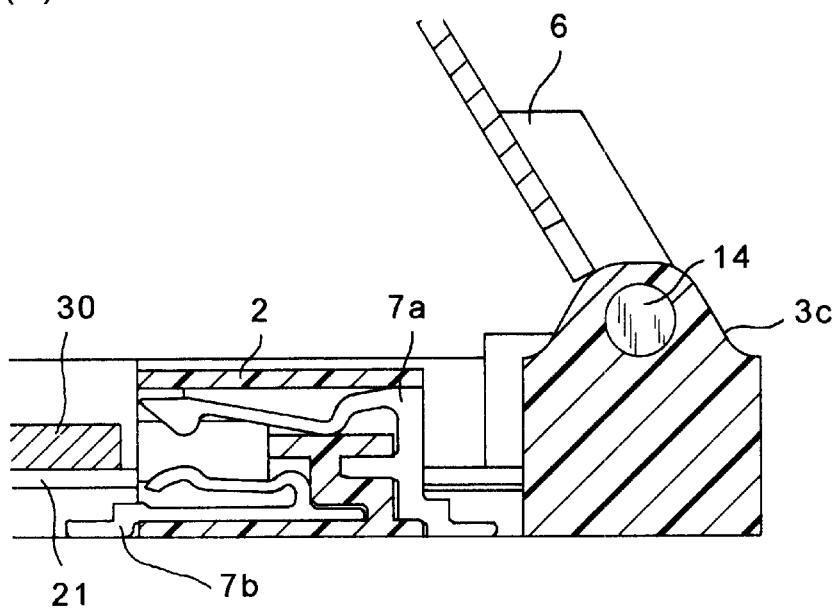
FIG. 8(*a*) is a sectional view of the portion of the connector of FIG. 1 near the housing, showing the state of the cover being opened.
Figure 8:
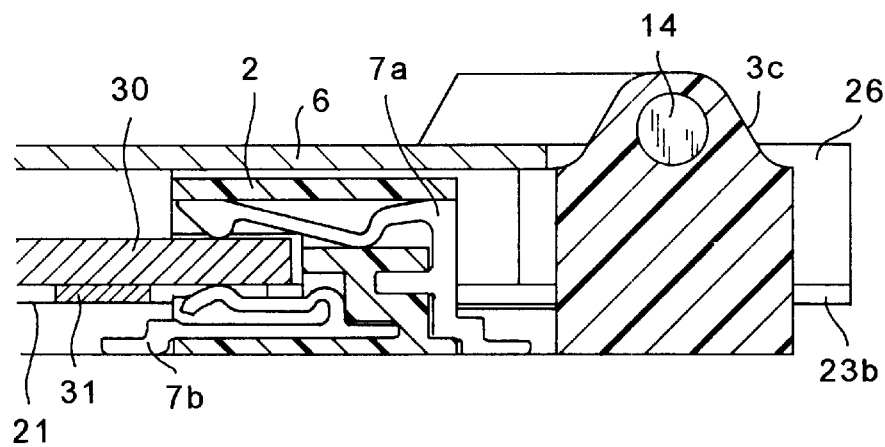

Next, the operation involved in the loading and unloading of the memory module 30 from the connector 1 of this embodiment will be described with further reference to FIGS. 7 and 8. FIG. 7 is a perspective view of the connector 1 of this embodiment of which cover is in the opened state, showing the state in which the memory module 30 is supported to the slider 5. FIG. 8 is a sectional view of the portion of the connector 1 near the housing, FIG. 8(a) showing the state of the cover being opened and FIG. 8(b) showing the state of the cover being closed.

When the connector 1 of this embodiment is loaded with the memory module 30, the memory module 30 is put on the slider 5, with the cover 6 opened, so that it can be supported thereon, as shown in FIG. 7. At that time, the slider 5 is in its shifted position away from the housing 2, so that the memory module 30 can be put on the slider 5 with comparative ease. When the memory module 30 is put on and thus supported by the slider 5, it is only necessary that the projections 24 on the slider 5 are inserted into the holes 35 in the memory module 30. At that time, the memory module 30 is away from the housing 2 and the conductive pads 32 are not in contact with the upper and lower contacts 7a, 7b, as shown in FIG. 8(a). At the same time as the memory module 30 is supported on the slider 5, the key 25 of the slider is fitted in the key slot 34 of the memory module 30.

As the cover 6 is pushed down from the state of FIG. 8(a) to its closed state, the slider 5 is moved toward the upper and lower contacts 7a, 7b (rightward in the drawing), as mentioned above. As a result, a tip portion of the memory module 30 supported on the slider 5 is inserted into the housing 2 and is wedged between the upper and lower contacts 7a, 7b, as shown in FIG. 8(b). Thus, the conductive pads 32 provided on both sides of the memory module 30 are brought into contact with the upper contacts 7a and the lower contacts 7b and thereby the memory module 30 is connected with the upper contacts 7a and the lower contacts 7b. Immediately before this connection, the key 16 in the housing 2 is fitted in the key slot 33 of the memory module 30. Then, the cover 6 is closed, as shown in FIG. 2, and thereby the loading of the memory module 30 to the connector 1 is completed.

On the other hand, when the memory module 30 is unloaded from the connector 1, the cover 6 is opened from the state of FIG. 8(b). Then, the slider 5 is moved away from the upper and lower contacts 7a, 7b (leftward in the drawing). As a result, the memory module 30 supported by the slider 5 is put into the state in which they are not connected with the upper and lower contacts 7a, 7b, as shown in FIG. 7 and FIG. 8(a), and also the engagement between the key slot 33 and the key 16 is released. In this state, the memory module 30 can be unloaded from the connector 1 with ease by simply picking up the memory module 30.

Thus, the connector 1 of this embodiment is designed to have such a simple structure that the cover 6 is supported by the shaft 14 to be rotated around it and also the slider 5 and the cover 6 are rotatably connected with each other at a position shifted from the shaft 14, whereby the slider 5 and the memory module 30 can be moved reciprocally with respect to the upper and lower contacts 7a, 7b in association with the rotation of the cover 6, to selectively switch between the connected mode and the non-connected mode of the memory module 30. Then, the loading of the memory module 30 to the connector 1 only requires two steps that the memory module 30 is supported on the slider 5 and then the cover 6 is closed and entails no troublesome manipulation. The same applies to the unloading of the memory module 30 from the connector 1 as well. Also, since the memory module 30 can be loaded in place without applying a relatively large force to the memory module to press it in against the elasticity of the coil springs, the loading work of the memory module can be performed with ease. Further, no elastic members such as coil springs are required, thus yielding a simplified structure and reduced manufacturing costs.

In addition, there is no need to touch the memory module 30 directly with one's hand when the cover 6 is opened or closed, so that local application of an excessive force to the connector 1 and the memory module 30 is avoided and, thus, the damage or deformation of these components can be prevented.

Also, in the connector 1 of this embodiment, when the memory module 30 is connected with the upper and lower contacts 7a, 7b, the whole area of the memory module 30 is covered with the cover 6, so that the memory module 30 can be protected from dust when connected therewith.

Therefore, malfunction caused by loose connection or short circuit can be prevented effectively.

Since the cover 6 is made of metallic material, even when unwanted electromagnetic waves are produced from the memory module 30 or a connecting part between the memory module and the contacts 7a, 7b, it can shield the electromagnetic waves not to let them leak out. Also, since electromagnetic waves from outside can be shielded by the cover 6, the operation of the memory module 30 can be prevented from being adversely affected by the electromagnetic waves from outside.

Also, in the connector 1 of this embodiment, since the cover 6 rotates around the shaft 14 extending substantially in parallel to the bearing surface for the memory module 30, the cover 6 does not protrude outside of a plane area defined by the cover 6 when the memory module 30 and the contacts 7a, 7b are contacted with each other (i.e., when the cover 6 is closed). Therefore, even when an extra space is not found at the outside of the plane area, the connection between the memory module 30 and the contacts 7a, 7b can be realized by rotating the cover 6.

Figure 9A:
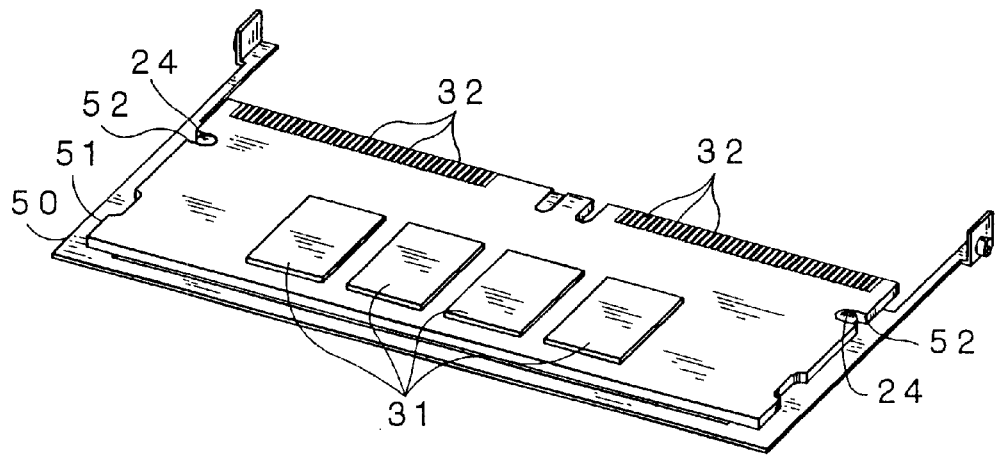
FIGS. 9(*a*), (*b*) and (*c*) are perspective views for illustration of variants on the form of the memory module to be supported to the slider in a detachable manner.

Referring now to FIGS. 9(a), (b) and (c), variants of the slider 5 and the memory module 30 used in this embodiment will be described next. FIGS. 9(a), (b) and (c) are perspective views for illustration of variants on the form of the memory module to be supported to the slider in a detachable manner. As those variants are identical to the above-described embodiment in construction of the slider and memory module, except the following points, the detailed explanation thereon will be omitted herein.

An example of the variant shown in FIG. 9(a) will be described first. In this variant, a slider 50 is identical to the slider 5 shown in FIG. 5, whereas a memory module 51 is different from the memory module 30 shown in FIG. 3 in that instead of the holes, recesses 52 are provided at positions corresponding to the protrusions 24. The engagement between the protrusions 24 and the recesses 52 permits the memory module 51 to be supported to the slider 50 in a detachable manner. For avoidance of a possible damage of the holes which may be caused when the holes are formed in a portion of the base close to the edge, the recesses 52 are used instead of the holes.

Figure 9B:
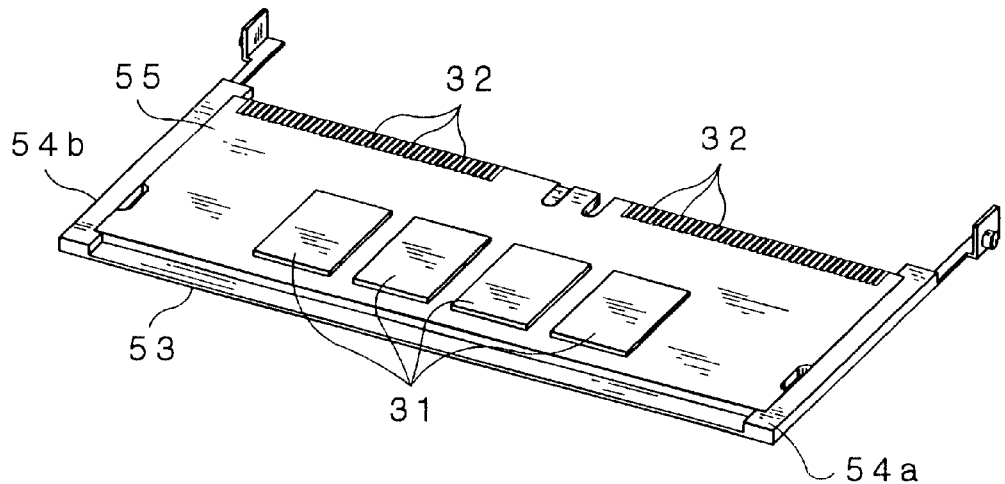

In another variant shown in FIG. 9(b), instead of the projections 24 on the slider 5 shown in FIG. 5, a pair of generally U-shaped protrusions 54a, 54b are provided at opposite ends of a slider 53. The memory module 55 is fitted in between the protrusions 54a, 54b to be detachably supported by the slider 53. Due to this, the memory module 55 is provided with no holes and recesses.

Figure 9C:
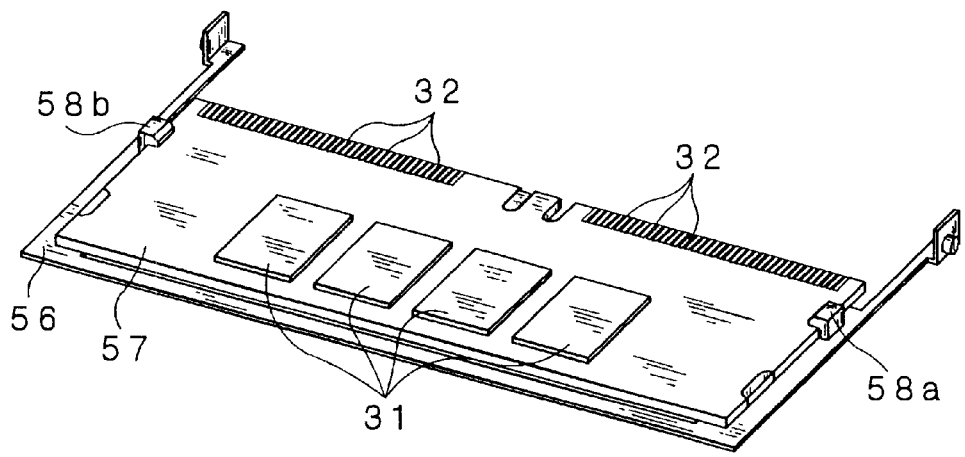

In still another variant shown in FIG. 9(c), a slider 56 is provided with a pair of engaging claws 58a, 58b projected inwardly toward the tips to be engaged with opposite ends of a memory module 57. The memory module 57 is engaged with the pair of engaging claws 58a, 58b to be detachably supported by the slider 56. Due to this, the memory module 57 is provided with no holes and recesses, either. In the variants shown in FIGS. 9(a), 9(b), there is no need to provide any holes and recesses in the memory module, which is of advantageous in that a general-purpose memory module can be used as it is without working it.

Next, description on a connector according to the second embodiment of the invention which is to be loaded to the memory module for the notebook-size personal computer will be given. It is to be noted that in this embodiment, common reference numerals refer to corresponding parts to those of the first embodiment, though description thereon will be omitted.

Figure 10:
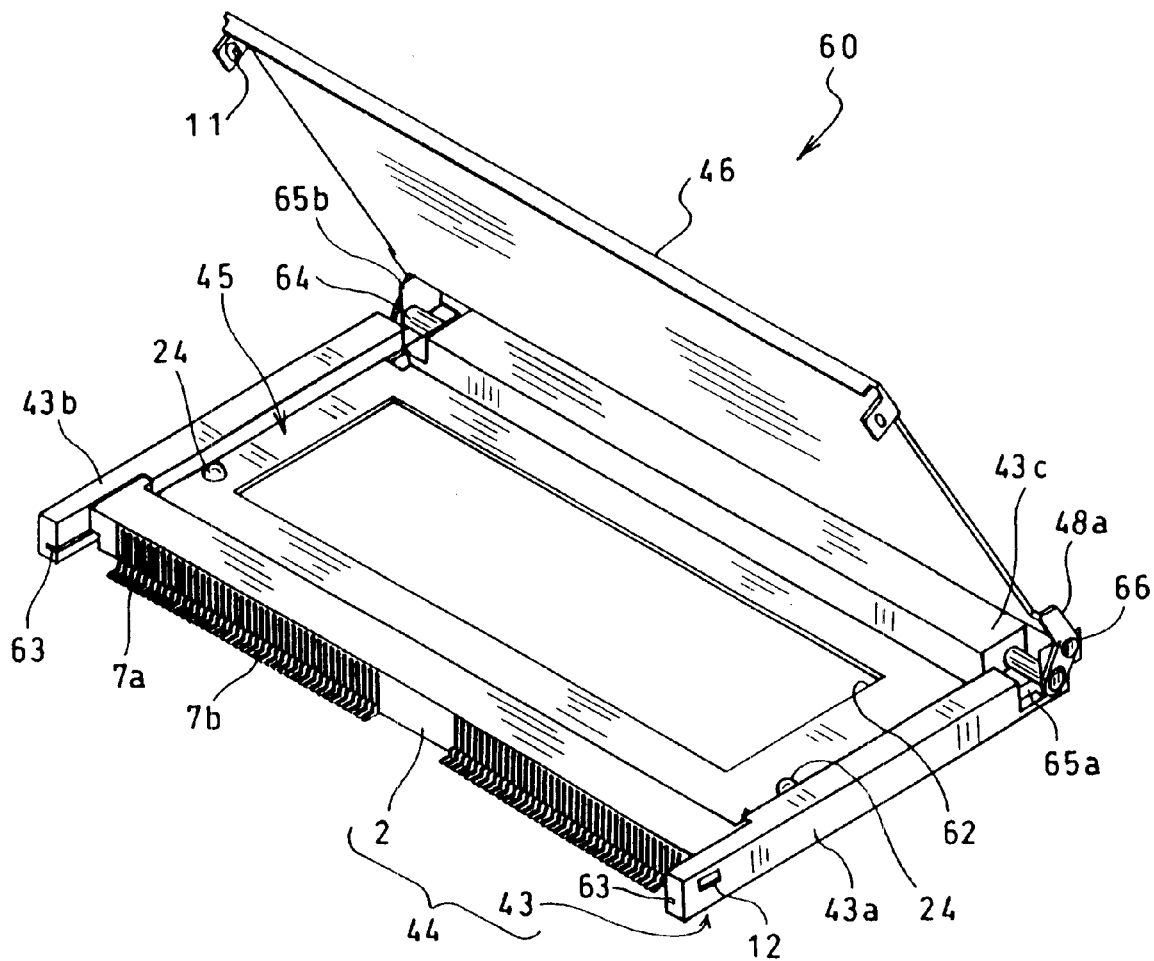
FIG. 10 is a perspective view of a connector according to the second embodiment of the invention which is to be loaded with the memory module for the notebook-size personal computer, showing the state of the cover being opened.
Figure 12:
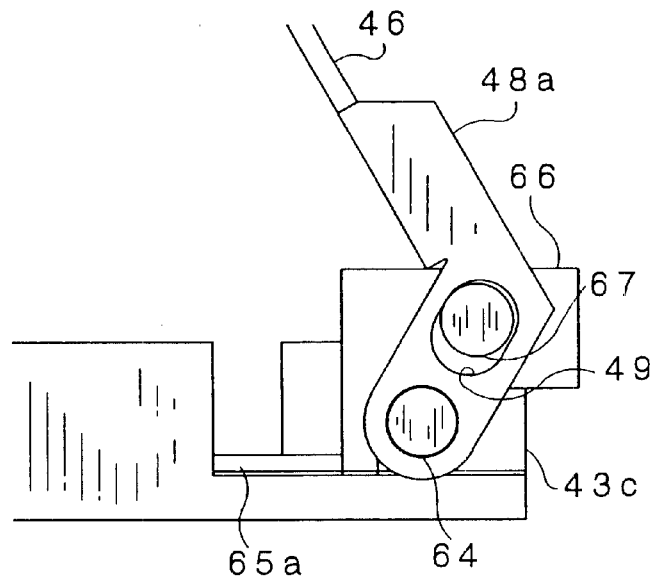
FIG. 12(*a*) is a side elevation view of a connecting portion of the connector of FIG. 10 at which the slider and the cover are connected together, showing the state of the cover being opened.
Figure 12:
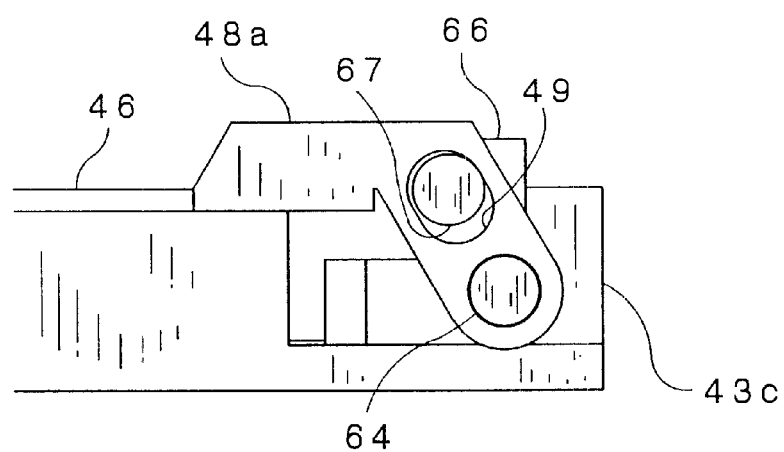

Referring to FIGS. 10 and 11, there are shown perspective views of the connector according to the second embodiment of the invention which is to be loaded with the memory module for the notebook-size personal computer. FIG. 10 shows the state of the cover being opened and FIG. 11 shows the state of the cover being closed. FIG. 12 is a side elevation view of a connecting portion at which the slider and the cover are connected together. FIG. 12(a) shows the state of the cover being opened and FIG. 12(b) shows the state of the cover being closed.

The connector 60 of the embodiment shown in FIGS. 10 and 11 has a main body 44 comprising a housing 2 and a base 43, a slider 45 mounted on the base 43 in such a manner as to be reciprocally slidable away from and toward the housing 2, and a cover 46 rotatably mounted on the base 43. The base 43 is composed of two spaced apart arms 43a, 43b and a connecting portion 43c connected with the two arms 43a, 43b at one end thereof. The housing 2 is connected with the two arms 43a, 43b in parallel to the connecting portion 43c on the side opposite the connecting portion 43c. The arms 43a, 43b have in their inside surfaces slots 63 extending along the extending direction of the arms 43a, 43b. End portions of the slider 45 are inserted in the slots 63 so that the slider 45 can be slid. A hole is formed in the connecting portion 43c of the base 43 toward the upper end, extending along the extending direction, and a shaft 64 is inserted in the hole.

The slider 45 is provided with a rectangular frame 61 formed to surround an opening 62 and arms 65a, 65b extending from opposite ends of the frame 61 in the widthwise direction. The arms 65a, 65b have bent portions 66 bent upwards into a stepped shape at positions close to the ends and columnar protrusions 67 formed outside of the bent portions.

The cover 46 made of metallic material is formed to have a size to cover the whole area of the memory module 30 when the cover is closed, as shown in FIG. 11. The cover 46 is provided at both ends thereof with two bent arms 48a, 48b which are bent inwardly toward the ends. The bent arms 48a, 48b are rotatably connected with the shaft 64 at portions thereof close to the ends. Thus, the cover 46 can be allowed to rotate around the shaft 64 in both directions. The bent arms 48a, 48b have generally elliptical holes 49 formed near the bent portions thereof. The columnar protrusions 67 of the slider 45 are inserted in the holes 49 and thereby the slider 45 and the cover 46 are rotatably connected.

Thus, when the cover 46 is rotated around the shaft 64 from its opened state shown in FIG. 12(*a*) until its closed state shown in FIG. 12(*b*), the bent arms 48a, 48b at portions between the holes 49 and the shaft 64 move leftward in the drawing, in association with which the columnar protrusions 67 are moved vertically in reciprocation within the holes 49, while moving leftward in the drawing. As a result, the slider 45 is moved toward the upper and lower contacts 7a, 7b in the housing 2. When the cover 46 is rotated around the shaft 64 from its closed state shown in FIG. 12(*b*) until its opened state shown in FIG. 12(*a*), the bent arms 48a, 48b at portions between the holes 49 and the shaft 64 move rightward in the drawing, in association with which the slider 45 moves away from the upper and lower contacts 7a, 7b in the housing 2. In short, the slider 45 moves reciprocally with respect to the upper and lower contacts 7a, 7b in association with the rotation of the cover 46.

When the connector 60 of this embodiment is loaded with the memory module 30, it is only required that the memory module 30 is put on the slider 5, with the cover 46 opened, so that it can be supported by the slider 45, and then the cover 46 is closed. This permits the slider 45 to be moved toward the upper and lower contacts 7a, 7b, so that the conductive pads 32 provided on both sides of the memory module 30 are brought into contact with the upper contacts 7a and the lower contacts 7b to allow the memory module 30 to be connected with the upper contacts 7a and the lower contacts 7b. Then, the cover 46 is closed, as shown in FIG. 11, and thereby the loading of the memory module 30 to the connector 60 is completed.

When the memory module 30 is unloaded from the connector 60, the cover 46 is opened from the state of FIG. 11. Then, the slider 45 is moved away from the upper and lower contacts 7a, 7b. As a result, the memory module 30 are put into the state in which it is not in connection with the upper and lower contacts 7a, 7b. In this state, the memory module 30 can be unloaded from the connector 60 with ease by simply picking up the memory module 30.

Thus, according to the connector 60 of this embodiment, similar to the first embodiment, the connector is designed to have such a simple structure that the cover 46 is supported by the shaft 64 to be rotatable around it and also the slider 45 and the cover 46 are rotationally connected with each other at a position shifted from the shaft 64, whereby the slider 45 and the memory module 30 can be moved reciprocally with respect to the upper and lower contacts 7a, 7b in association with the rotation of the cover 46, to selectively switch between the connected mode of the memory module 30 and the non-connected mode of the same.

In addition, in this embodiment, since the housing 2 in which the upper and lower contacts 7a, 7b are arranged and the shaft 64 around which the cover 46 is rotated are located at opposite sides of the arms 43a, 43b of the base 43, when vibrations occur, the memory module 30 that swings around the contacts 7a, 7b increases in amplitude at the shaft 64 side but decreases in amplitude at the housing 2 side. In other words, the memory module 30 decreases comparatively in amplitude at a locking portion at which the cover 46 is locked by the protrusions 11 at the cover 46 being engaged with the recesses 12 in the base 43 when the memory module 30 and the contacts 7a, 7b are connected. Thus, a large force caused by the vibrations is not applied to the locking portion at which the cover 46 is locked to the main body 44, thus providing the advantage that the locking of the cover 46 to the main body 44 can be prevented from being released needlessly.

Figure 13:
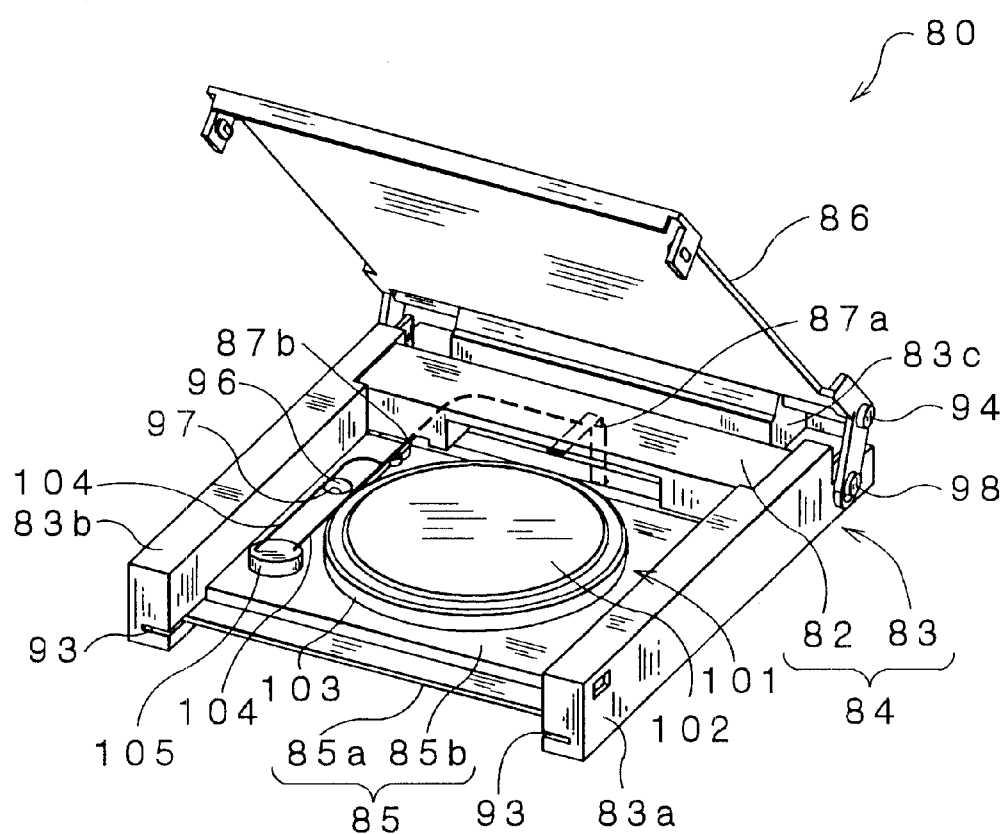
FIG. 13 is a perspective view of a connector according to the third embodiment of the invention.

Next, a connector according to the third embodiment of the invention which is to be loaded with a button battery will be described with reference to FIGS. 13–15. FIG. 13 is a perspective view of a connector of the third embodiment, with the cover opened, showing the state in which the button battery is supported by the slider. FIG. 14 is a sectional view of the connector of this embodiment, FIG. 14(*a*) showing the state of the cover being opened, and FIG. 14(*b*) showing the state of the cover being closed. FIG. 15 is a circuit diagram of the connector and the button battery of this embodiment, with the cover opened.

The connector 80 of this embodiment has a main body 84 comprising a housing 82 and a base 83, a slider 85 mounted on the base 83 in such a manner as to be reciprocally sidable away from and toward the housing 82, and a cover 86 rotatably mounted on the base 83.

As shown in FIG. 13, the base 83 is composed of two spaced apart arms 83a, 83b and a connecting portion 83c connected with the two arms 83a, 83b at one ends thereof. The housing 82 is connected with the two arms 83a, 83b at a position close to the connecting portion 83c. The arms 83a, 83b have in their inside surfaces slots 93 extending along the extending direction of the arms 83a, 83b. A hole is formed in the connecting portion 83c of the base 83 toward the upper end, extending along the extending direction, and a shaft 94 is inserted in the hole. The cover 86 is rotatable around the shaft 94. Further, columnar protrusions 98 provided at both ends of the slider 85 are connected with the cover 86 at a position shifted from the shaft 94 in the rotational relation, as illustrated on FIGS. 6(*a*), (*b*). Thus, the slider 85 is moved reciprocally with respect to the housing 82 in association with the open and close motion of the cover 86.

The slider 85 is composed of a lower slider 85a and an upper slider 85b. The lower slider 85a is provided with two projections 96 (only one projection is shown in FIG. 13) and the upper slider 85b is provided with two holes 97 (only one hole is shown in FIG. 13) at positions corresponding to the projections 96. The insertion of the projections 96 in the holes 97 permits the upper slider 85b to be detachably supported on the lower slider 85a. A bottom of the button battery 101 is fitted in a recess (not shown) in a top surface of the upper slider 85b, whereby the button battery 101 is detachably supported on the upper slider 85b.

As shown in FIGS. 13 and 14(*a*), a minus contact 87a that contacts with a negative electrode 102 of the button battery 101 when the cover 86 is closed is located in the housing 82. When the button battery 101 is placed on the upper slider 85b, a positive electrode 103 of the button electrode 101 is brought into contact with a first plus contact 87*b* fixed on the upper slider 85*b*. A second plus contact 87*c* is located in the housing 82. When the cover 86 is closed, the tip of the first plus contact 87*b* is inserted into the housing 82 and brought into contact with the second plus contact 87*c*. An electrolytic capacitor 105 is connected between the minus contact 87*a* and the first plus contact 87*b* via a lead wire 104.

Thus, when the cover 86 is pressed down from the state shown in FIG. 14(*a*) until it is closed, the slider 85 is moved toward the housing 82 (rightward as viewed in illustration). As a result, the button battery 101 supported by the slider 85 is partially fitted into the housing 82, as shown in FIG. 14(*b*), to permit the negative electrode 102 to contact with the minus contact 87*a* and also permit the first plus contact 87*b* to contact with the second plus contact. When the cover 86 is closed as shown in FIG. 14(*b*), the loading of the button battery 101 to the connector 80 is completed.

At that time, the button battery 101 is put in the state of being connected in parallel with the electrolytic capacitor 105, as shown in FIG. 15. The storage to the electrolytic capacitor 105 permits a large electric current to be prevented from instantaneously passing through equipment having the connector 80 immediately after connection, so as to prevent breakage of circuit components in the equipment.

When the button battery 101 is unloaded from the connector 80, the cover 86 is opened from the state of FIG. 14(*b*). Then, the slider 85 is moved away from the housing 82 (leftwards as viewed in illustration). As a result, the negative electrode 102 of the button electrode 101 supported by the slider 85 is put in non-contact with the minus contact 87*a*, as shown in FIGS. 13 and 14(*a*), and the first plus contact 87*b* is also put in non-contact with the second plus contact 87*c*. In this state, the button battery 101 can be unloaded from the connector 80 with ease by simply picking up the button battery 101.

Thus, according to the connector 80 of this embodiment, the slider 85 and the button battery 101 can be moved reciprocally with respect to the housing 82 in association with the rotation of the cover 86, to selectively switch between the connected mode of the button battery 101 and the non-connected mode of the same. Then, the loading of the button battery 101 to the connector 80 only requires two steps that the button battery 101 is supported on the slider 85 and then the cover 86 is closed and entails no troublesome manipulation. The same applies to the unloading of the button battery 101 from the connector 80 as well. Also, since no elastic members such as coil springs are used, no such a troublesome work that the button battery 101 is pressed in against elasticity of the coil springs is necessary, thus providing the advantage of simplifying the structure of device. In addition, when the cover 86 is closed, the whole area of the button battery 101 is covered with the cover 86, as shown in FIG. 14(*b*), thus providing the effect of protecting and shielding the button battery from dust, as is the case with the first embodiment.

As noted in this embodiment, the connector of the present invention can be applied not only as the connector for the memory module of a personal computer, as noted in the first and second embodiments, but also as the connector for a battery such as a button battery, a gum pack battery and a dry battery, by suitably modifying the arrangement and configuration of the contacts for the connection object. Similarly, the connector of the present invention can be applied as the connector for a fuse or various types of cards (a CF card, a smart media, a PCMCIA card and a MMC).

Figure 16:
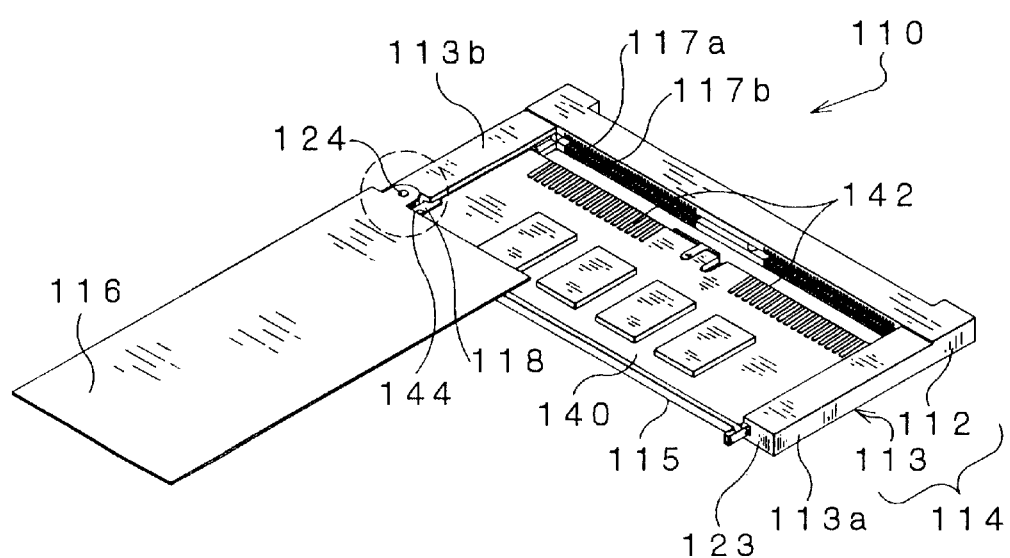
FIG. 16 is a perspective view of a connector according to the fourth embodiment of the invention which is to be loaded with the memory module for the notebook-size personal computer, showing the state of the cover being opened.
Figure 17:
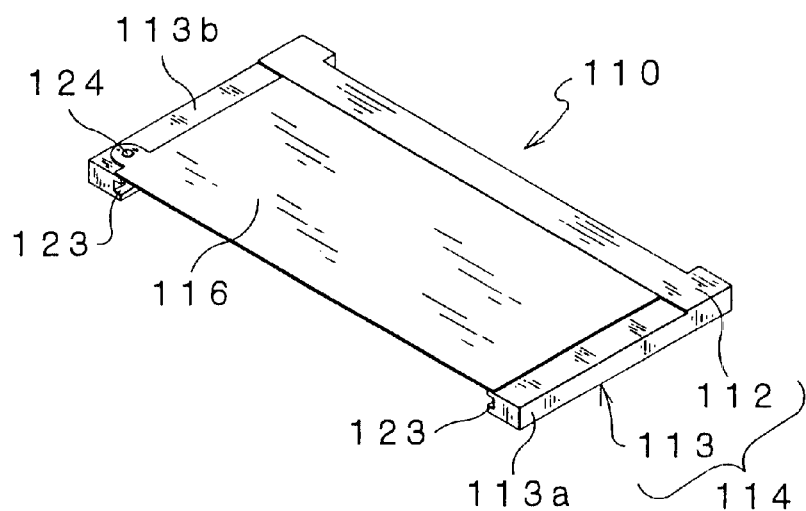
FIG. 17 is a perspective view of the connector of FIG. 16, showing the state of the cover being closed.
Figure 18:
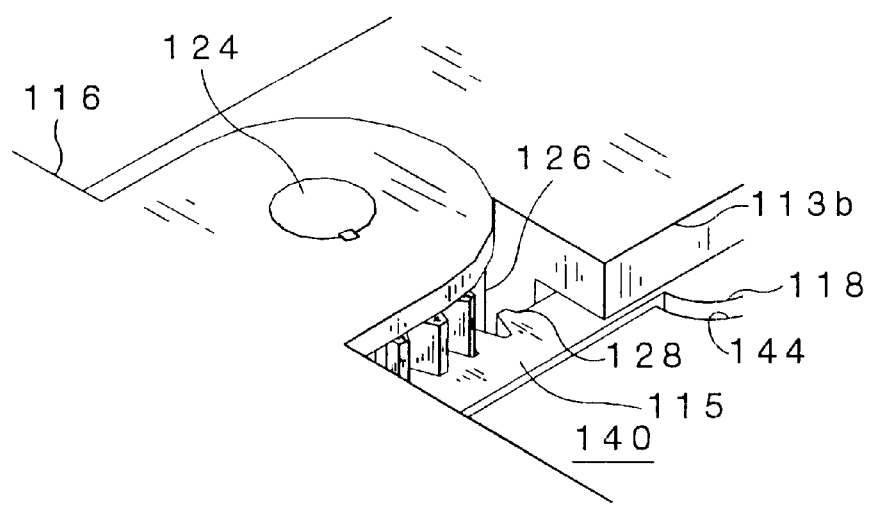
FIG. 18 is an enlarged view of the part encircled by a broken line in FIG. 16.

Next, a connector according to the fourth embodiment of the invention which is to be loaded with a memory module for a notebook-size personal computer will be described with reference to FIGS. 16–18. FIG. 16 is a perspective view of a connector with a cover opened of this embodiment, showing the state in which a memory module is supported by a slider. FIG. 17 is a perspective view of the connector with the cover closed of this embodiment. FIG. 18 is an enlarged view of the part encircled by a broken line in FIG. 16.

The connector 110 of this embodiment has a main body 114 into which a housing 112 and a base 113 are integrally formed, a slider 115 mounted on the base 113 in such a manner as to be reciprocally slidable away from and toward the housing 112, and a cover 116 mounted on the base 113 so as to rotate in the horizontal plane.

As shown in FIGS. 16 and 17, the base 113 is composed of two spaced apart arms 113*a*, 113*b*. The housing 112 is connected with the two arms 113*a*, 113*b* at opposite ends thereof. The arms 113*a*, 113*b* have in their inside surfaces slots 123 extending along the extending direction of the arms 113*a*, 113*b*, and end portions of the slider 115 are inserted in the slots 123. The slider 115 is provided with projections 118 which are engageable with cutouts 144 at the ends of the memory module 140 so that the memory module 140 can be detachably supported by the slider. It is to be noted that as the memory module 140 is identical in structure to that as illustrated in the first embodiment, except that the cutouts 144 are provided but no holes are provided, the description thereon will be omitted herein. A shaft 124 extending vertically to a sliding surface of the slider 115 is provided in one arm 113*b* of the base 113 toward the tip. The cover 116 is rotatable around the shaft 124 in the horizontal plane. When the cover 116 is closed, both ends of the cover 116 are placed on the arms 113*a*, 113*b*. Similarly to the upper contacts 7*a* and the lower contacts 7*b* as illustrated in FIG. 4, upper contacts 117*a* and lower contacts 117*b* are arranged in the housing 112.

As shown in FIG. 18, the shaft 124 is formed in the form of a pinion 126 under the cover 116. The pinion 126 is engaged with a rack 128 provided in a side surface of the slider 115 at each end thereof. Thus, the rotation of the shaft 124 is converted into a linear motion of the slider 115 in the extending direction of the arms 113*a*, 113*b* of the base 113 by the pinion 126 and the rack 128. This means that when the cover 116 is rotated around the shaft 124, the slider 115 is moved reciprocally with respect to the upper and lower contacts 117*a*, 117*b*.

When the memory module 140 is loaded to the connector 110 of this embodiment, the memory module 140 is supported on the slider 115, with the cover 116 opened, as shown in FIG. 16, and then the cover 116 is closed to let the slider 115 move toward the housing 112. Then, the memory module 140 supported by the slider 115 is inserted into the housing 112, so that the conductive pads 142 of the memory module 140 are brought into contact with the upper contacts 117*a* and the lower contacts 117*b*. Then, the cover 116 is closed, as shown in FIG. 17, and thereby the loading of the memory module 140 to the connector 110 is completed.

When the memory module 140 is unloaded from the connector 110, the cover 116 is opened from the state of FIG. 17. Then, the slider 115 is moved away from the housing 112 and, as a result, the conductive pads 142 of the memory module 140 are put into the state in which they are not in contact with the upper and lower contacts 117*a*, 117*b*. In this state, the memory module 140 can be unloaded from the connector 110 with ease by simply picking up the memory module 140.

Thus, according to the connector 110 of this embodiment, a simple gear mechanism comprising the rack 128 and pinion 126 is used to permit the memory module 140 supported by the slider 115 to be moved reciprocally with respect to the housing 112 in association with the rotation of the cover 116, to selectively switch between the connected mode and the non-connected mode of the memory module 140. Then, the loading of the memory module 140 to the connector 110 only requires two steps that the memory module 140 is supported on the slider 115 and then the cover 116 is closed and entails no troublesome manipulation. The same applies to the unloading of the memory module 140 from the connector 110 as well. Also, since no elastic members such as coil springs are used, no such a troublesome work that the memory module 140 is pressed in against elasticity of the coil springs is necessary, thus providing the advantage of simplifying the structure of device. In addition, when the cover 116 is closed, the whole area of the memory module 140 is covered with the cover 116, as shown in FIG. 17, thus providing the effect of protecting and shielding the memory module 140 from dust, as is the case with the first embodiment.

Also, according to the connector 110 of this embodiment, since the rotation of the cover 116 around the shaft 124 permits the memory module 140 to move in substantially parallel to a bearing surface for the memory module 140, even when a sufficient space is not found over the connector 110 or in a direction vertical to the bearing surface for the memory module 140, the cover 116 can be moved to realize the connection between the memory module 140 and the contacts 117a, 117b.

Figure 19:
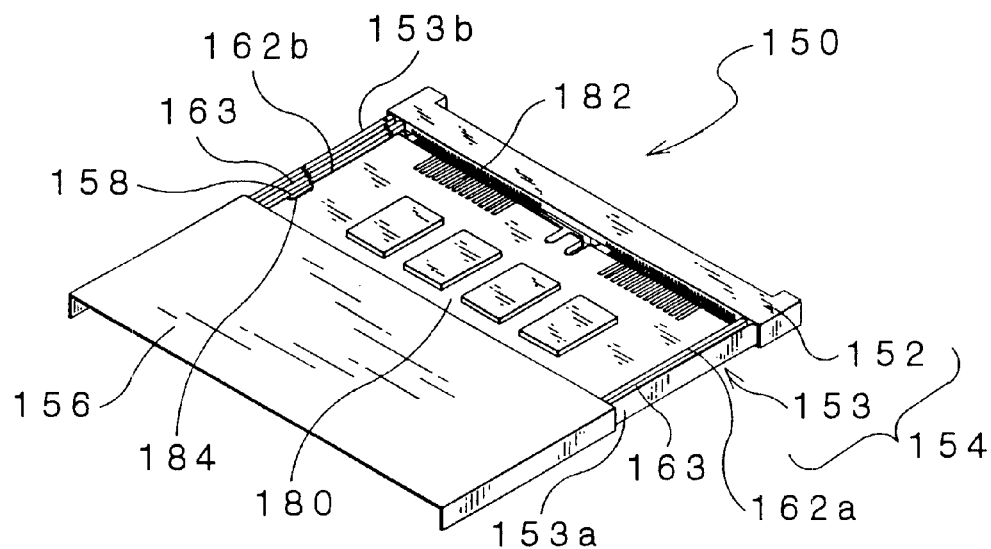
FIG. 19 is a perspective view of a connector according to the fifth embodiment of the invention which is to be loaded with the memory module for the notebook-size personal computer, showing the state of the cover being opened.
Figure 20:
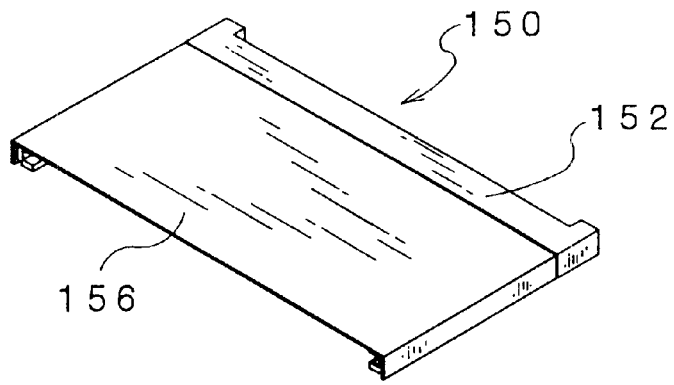
FIG. 20 is a perspective view of the connector of FIG. 19, showing the state of the cover being closed.

Next, description on a connector according to the fifth embodiment of the invention which is to be loaded with the memory module for the notebook-size personal computer will be given with reference to FIGS. 19–22. FIG. 19 is a perspective view of the connector with the cover opened of this embodiment of the invention, showing the state of the memory module being supported on the slider. FIG. 20 is a perspective view of the connector with the cover closed of this embodiment. FIG. 21 is a perspective view of the slider used in the connector of this embodiment. FIGS. 22(a)–(e) are sectional views of the connector of this embodiment, taken along an arm of the base.

The connector 150 of this embodiment has a main body 154 into which a housing 152 and a base 153 are integrally formed, a slider 155 mounted on the base 153 in such a manner as to be reciprocally sidable away from and toward the housing 152 (See FIGS. 21 and 22), and a cover 156 mounted on the base 153 in a relation of being movable in parallel thereto.

As shown in FIG. 19, the base 153 is composed of two spaced apart arms 153a, 153b of L-shaped in section. The housing 152 is connected with the two arms 153a, 153b at opposite ends thereof. The arms 153a, 153b are provided, at their portions close to the tips, with rods 162a, 162b extending in parallel thereto. Projections 164 projecting from a bottom surface of the cover 156 (See FIG. 22) are inserted in between the arm 153a and the rod 162a and between the arm 153b and the rod 162b, respectively. Similarly to the upper contacts 7a and the lower contacts 7b as illustrated in FIG. 4, upper contacts and lower contacts (not shown) are arranged in the housing 152.

As shown in FIG. 21, the slider 155 is provided with a rectangular frame 168 formed to surround an opening 166. The frame 168 is provided, at two opposite ends thereof, with ridges 171 having noses 158 which are to be engaged with cutouts 184 in end portions of the memory module 180, to support the memory module 180 in a detachable manner. The engagement of the noses 158 in the cutouts 184 permits the memory module 180 to be detachably supported to the slider 155. An upper surface of the frame 168 forms a bearing surface for the memory module 180. Also, the frame 168 is provided, at a portion thereof corresponding in position to a key slot of the memory module 180, with a key 169 of a size and configuration to fit in the key slot. It is to be noted that as the memory module 180 is identical in structure to that as illustrated in the first embodiment, except that the cutout 184 is provided but no hole is provided, the description thereon will be omitted herein.

The ridges 171 have outward extending projections 172 at ends thereof on the housing 152 side. Split arms 173, which are thinner than the ridges 171 and are split from the ridges 171 at ends thereof on the housing 152 side, are provided at the outside of the ridges 171. The split arms 173 are projected downwards at the tips 174, whose lower surfaces are tapered off (See each of FIGS. 22).

In the state in which the slider 155 is mounted on the main body 154, the projections 172 and the tips 174 are between the arm 153a and the rod 162a and between the arm 153b and the rod 162b, respectively. When the slider 155 is apart from the housing 152, the tips 174 are in engagement with recesses 159 provided in upper surfaces of the arms 153a, 153b and having tapered slant surfaces on the housing 152 side, as shown in FIG. 22(a). When the cover 156 is slid rightwards in the drawing from this state, the projections 164 collide with the projections 172 and then push them toward the housing 152, as shown in FIG. 22(b).

Thus, the slider 155 is moved toward the housing 152 until the cover 156 collides with the housing 152 and the tips 174 of the split arms 173 come out of the recesses 159 and run on the upper surfaces of the arms 153a, 153b, as shown in FIG. 22(c).

Then, when the cover 156 is slid leftward in the drawing from this state, the projections 164 collide with the tips 174 and then push them in the direction opposite to the housing 152, as shown in FIG. 22(d). Thus, when the slider 155 are moved leftward in the drawing and the tips 174 come to the recesses 159, the tips 174 fall into the recesses 159 again. As a result, the tips 174 are no longer pressed by the projections 164 in the direction opposite to the housing 152, as shown in FIG. 22(e), so that the slider 155 comes to a standstill even when the cover 156 is slid leftwards any further. Thus, the slider 155 is moved reciprocally with respect to the housing 152 in association with the open and close of the cover 156.

When the memory module 180 is loaded to the connector 150 of this embodiment, the memory module 180 is supported on the slider 155, with the cover 156 opened, as shown in FIG. 19, and then the cover 156 is closed to let the slider 155 move toward the housing 152. Then, the memory module 180 supported by the slider 155 is inserted into the housing 152, so that the conductive pads 182 of the memory module 180 are brought into contact with the upper contacts and the lower contacts. Then, the cover 156 is closed, as shown in FIG. 20, and thereby the loading of the memory module 180 to the connector 150 is completed.

When the memory module 180 is unloaded from the connector 150, the cover 156 is opened from the state of FIG. 20. Then, the slider 155 is moved away from the housing 152 and, as a result, the conductive pads 182 of the memory module 180 are put into the state in which they are not in contact with the upper and lower contacts. In this state, the memory module 180 can be unloaded from the connector 150 by simply picking up the memory module 180.

Thus, according to the connector 150 of this embodiment, with a simple structure in which different parts of the slider 155 are pressed by the cover 155 depending on whether the memory module is moved toward the upper and lower contacts or away therefrom, the memory module 180 supported by the slider 155 is permitted to move reciprocally with respect to the housing 152 in association with the sliding motion of the cover 156, to selectively switch between the connected mode and the non-connected mode of the memory module 180. Then, the loading of the memory module 180 to the connector 150 only requires two steps that the memory module 180 is supported on the slider 155 and then the cover 156 is closed and entails no troublesome manipulation. The same applies to the unloading of the memory module 180 from the connector 150 as well. Also, since no elastic members such as coil springs are used, no such a troublesome work that the memory module 180 is pressed in against elasticity of the springs is necessary, thus providing the advantage of simplifying the structure of device. In addition, when the cover 156 is closed, the whole area of the memory module 180 is covered with the cover 156, as shown in FIG. 20, thus providing the effect of protecting and shielding the memory module from dust, as is the case with the first embodiment.

Besides, according to the connector 150 of this embodiment, since the sliding direction of the cover 156 and the traveling direction of the slider 155 are identical, there is provided an advantage that a user can easily know by intuition how to operate the cover 156 to load and unload the memory module 180.

Figure 23:
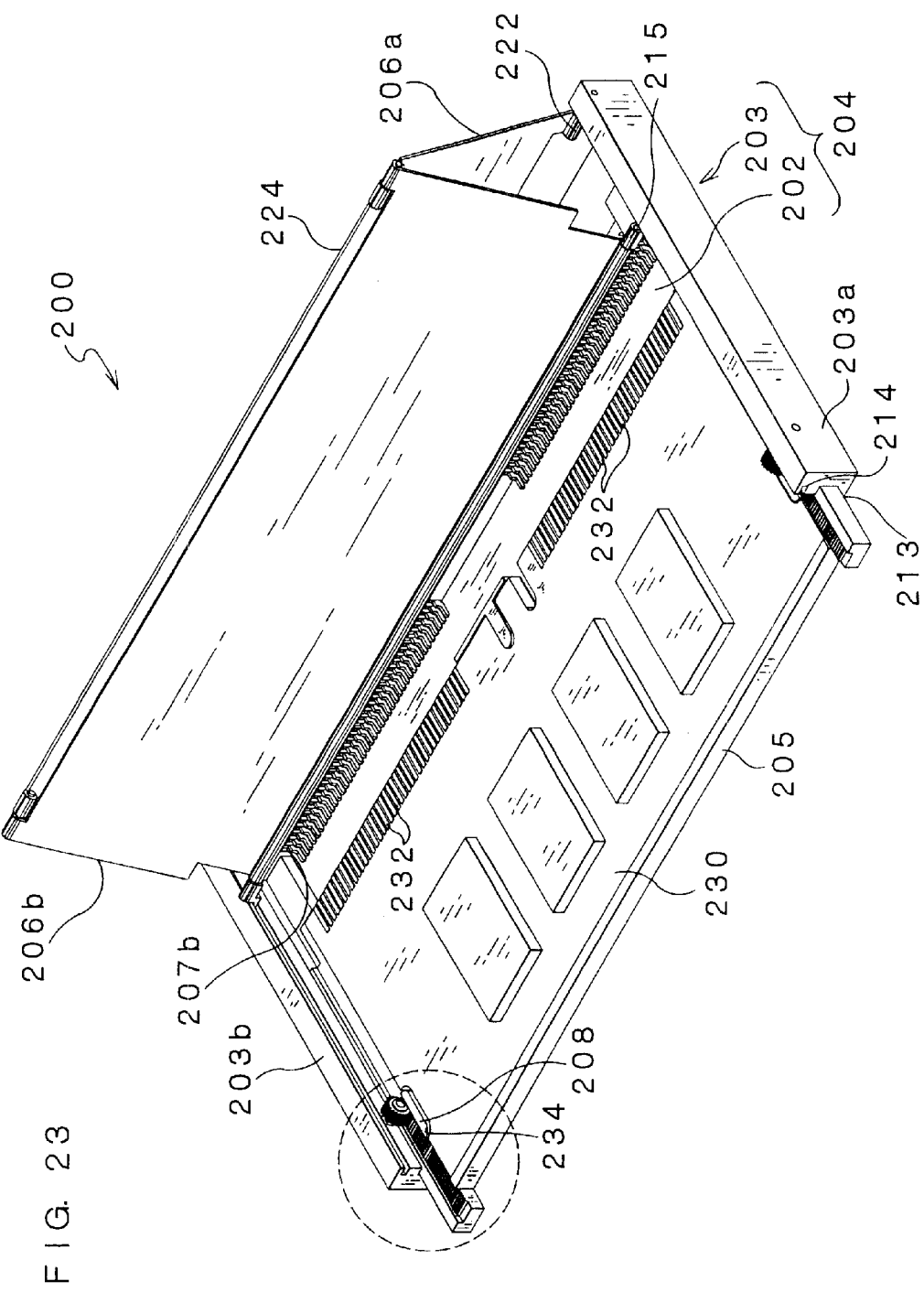
FIG. 23 is a perspective view of a connector according to the sixth embodiment of the invention which is to be loaded with the memory module for the notebook-size personal computer, showing the state of the cover being opened.
Figure 24:
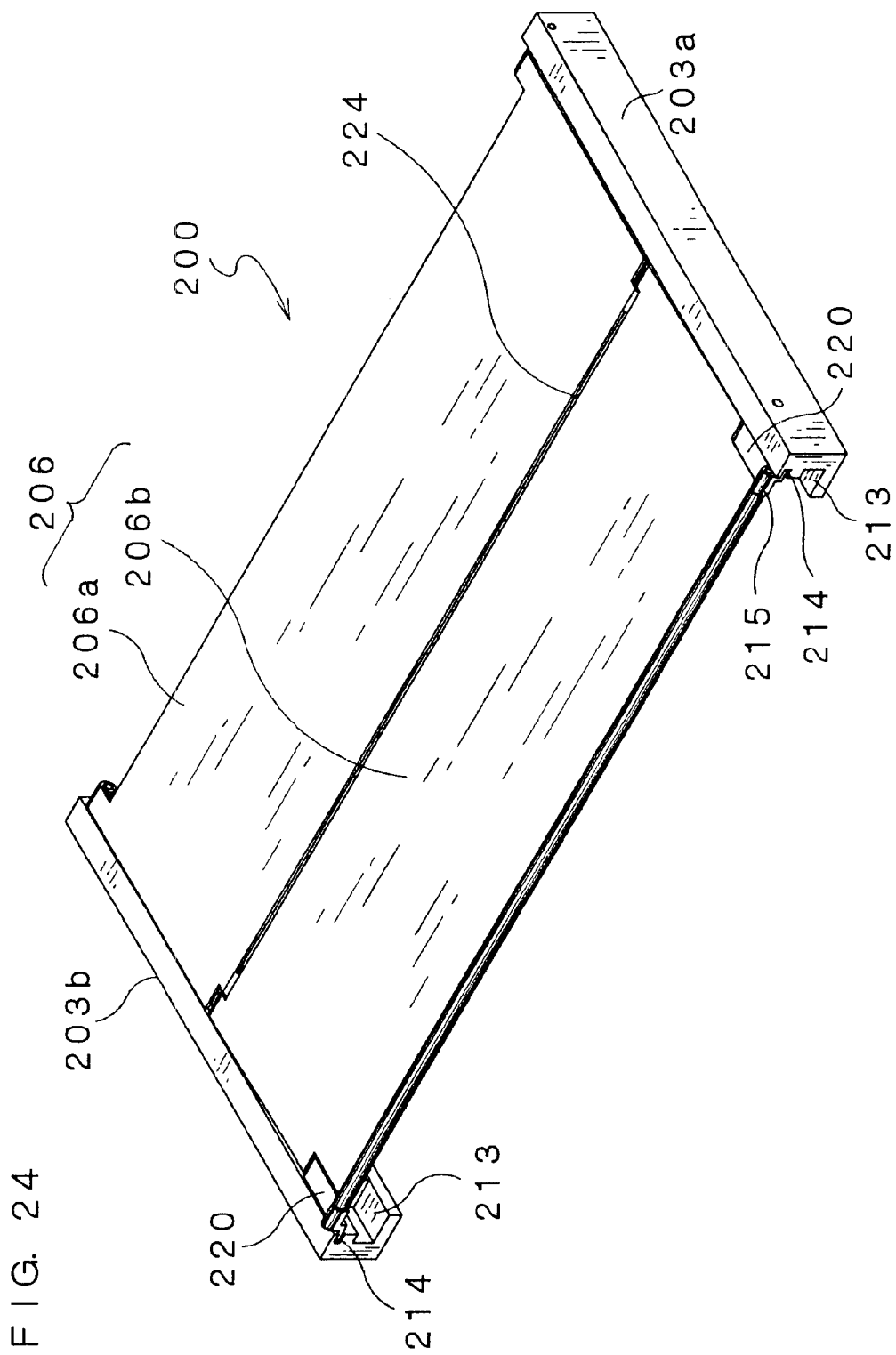
FIG. 24 is a perspective view of the connector of FIG. 23, showing the state of the cover being closed.
Figure 25:
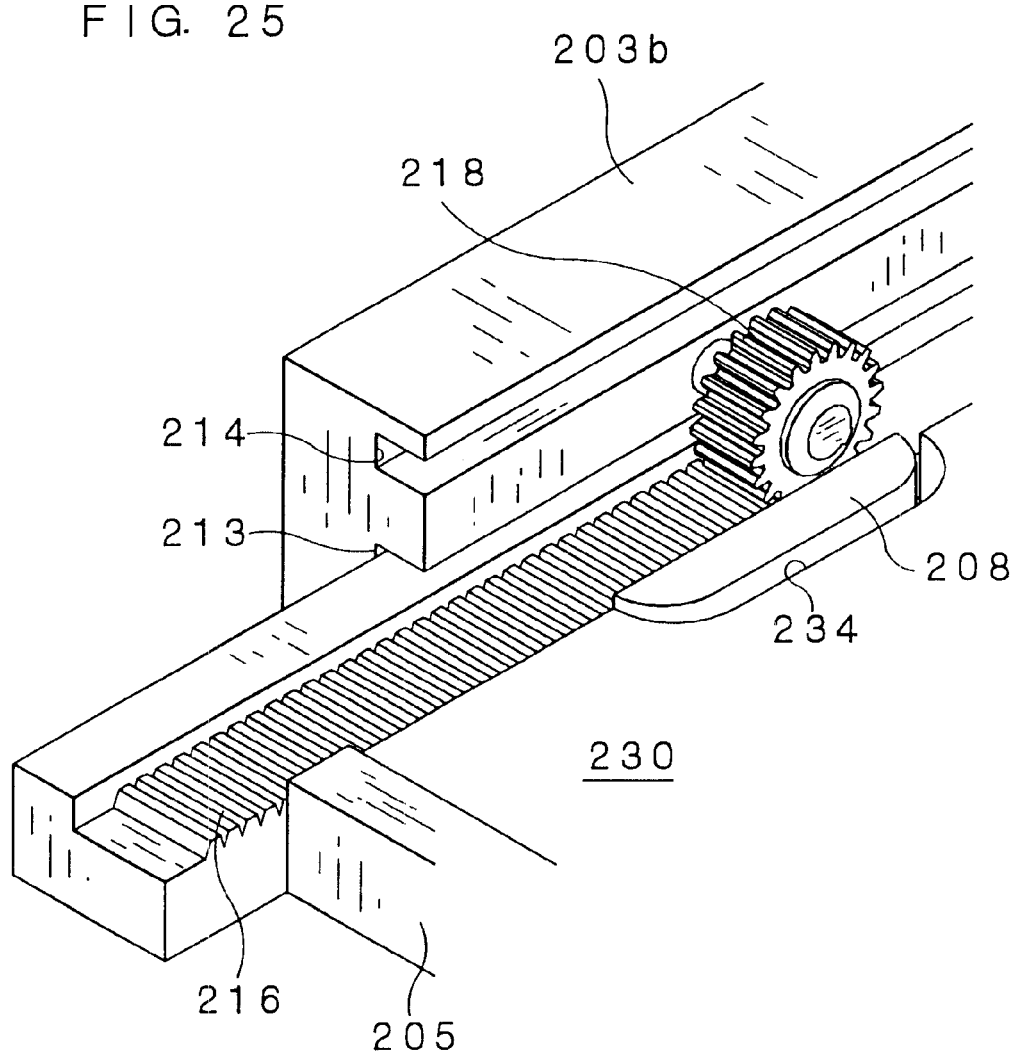
FIG. 25 is an enlarged view of the part encircled by a broken line in FIG. 23.

Next, a connector according to the sixth embodiment of the invention which is to be loaded with a memory module for a notebook-size personal computer will be described with reference to FIGS. 23–25. FIG. 23 is a perspective view of the connector with the cover opened of this embodiment, showing the state of the memory module being supported by a slider. FIG. 24 is a perspective view of the connector with the cover closed of this embodiment. FIG. 25 is an enlarged view of the part encircled by a broken line in FIG. 23.

The connector 200 of this embodiment has a main body 204 comprising a housing 202 and a base 203, a slider 205 mounted on the base 203 in such a manner as to be reciprocally slidable away from and toward the housing 202, and a cover 206 that is foldable into two.

As shown in FIGS. 23 and 24, the base 203 is composed of two spaced apart arms 203a, 203b. The housing 202 is connected with the two arms 203a, 203b at portions thereof close to the ends of these arms 203a, 203b. Each of the arms 203a, 203b has in its inside surface two slots 213, 214 extending along the extending direction of the arms 203a, 203b, and the slider 205 is inserted in the lower slots 213. The slider 205 is provided with projections 208 which are engageable with cutouts 234 at the ends of the memory module 230 so that the memory module 230 can be detachably supported by the slider. It is to be noted that as the memory module 230 is identical in structure to that as illustrated in the first embodiment, except that the cutouts 234 are provided but no holes are provided, the description thereon will be omitted herein. Two movable pieces 220 movable along the upper slots 214 are inserted in the upper slots 214. Similarly to the upper contacts 7a and the lower contacts 7b as illustrated in FIG. 4, upper contacts (not shown) and lower contacts 207b are arranged in the housing 202.

The two movable pieces 220 are connected with each other through a shaft 215 provided therebetween. The shaft 215 is movable in the extending direction of the slots 214 together with the movable pieces 220. The cover 206 is supported rotationally by the shaft 215 and a shaft 222 fixed between the arms 203a, 203b at the ends thereof The cover 206 is foldable into two parts 206a, 206b around a shaft 224 at a widthwise center portion thereof Accordingly, as the shaft 215 moves closer to the shaft 222, the cover 206 is folded further and the angle formed by the two parts 206a, 206b becomes smaller.

As shown in FIG. 25, racks 216 extending along the slots 213 are formed on an upper side of the slider 205 at opposite ends thereof. Also, pinions 218 projecting inwardly to engage with the racks 216 are provided between the two slots 213, 214. In addition, racks (not shown) are formed on lower surfaces of the movable pieces 220. Thus, when the movable pieces 220 are in opposition to the pinions 218, the pinions 218 are allowed to rotate in association with the movement of the movable pieces 220 and further the racks 216 are allowed to move back and forth in association with that rotation. For example, when the movable pieces 220 are moved in the direction in which the cover 206 is closed, the pinions 218 are rotated in the counterclockwise direction in the drawing and thereby the slider 205 having the racks 216 is moved toward the housing 202. When the movable pieces 220 are moved in the direction in which the cover 206 is opened, the pinions 218 are rotated in the clockwise direction in the drawing and thereby the slider 205 having the racks 216 is moved away from the housing 202. In short, the slider 205 is moved reciprocally with respect to the housing 202 in association with the open and close of the cover 206.

When the memory module 230 is loaded to the connector 200 of this embodiment, the memory module 230 is supported on the slider 205, with the cover 206 opened, as shown in FIG. 23, and then the cover 206 is closed to let the slider 205 move toward the housing 202. Then, the memory module 230 supported by the slider 205 is inserted into the housing 202, so that the conductive pads 232 of the memory module 230 are brought into contact with the upper contacts and the lower contacts 207b. Then, the cover 206 is closed, as shown in FIG. 24, and thereby the loading of the memory module 230 to the connector 200 is completed.

When the memory module 230 is unloaded from the connector 200, the cover 206 is opened from the state of FIG. 24. Then, the slider 205 is moved away from the housing 202 and, as a result, the conductive pads 232 of the memory module 230 are put into the state in which they are not in contact with the upper contacts and the lower contacts 207b. In this state, the memory module 230 can be unloaded from the connector 200 by simply picking up the memory module 230.

Thus, according to the connector 200 of this embodiment, in addition to the racks provided on the movable pieces 220, a simple gear mechanism comprising the racks 216 and pinions 218 is used to permit the memory module 230 supported by the slider 205 to be moved reciprocally with respect to the housing 202 in association with the rotation of the cover 206, to selectively switch between the connected mode and the non-connected mode of the memory module 230. Then, the loading of the memory module 230 to the connector 200 only requires two steps that the memory module 230 is supported on the slider 205 and then the cover 206 is closed and entails no troublesome manipulation. The same applies to the unloading of the memory module 230 from the connector 200 as well. Also, since no elastic members such as coil springs are used, no such a troublesome work that the memory module 230 is pressed in against elasticity of the coil springs is necessary, thus providing the advantage of simplifying the structure of device. In addition, when the cover 206 is closed, the whole area of the memory module 230 is covered with the cover 206, as shown in FIG. 24, thus providing the effect of protecting and shielding the memory module from dust, as is the case with the first embodiment.

Also, according to the connector 200 of this embodiment, since the cover 206 rotates around the shaft 222 extending substantially in parallel to the bearing surface for the memory module 230, the cover 206 does not protrude outside of a plane area defined by the cover 206 when the cover 206 is closed. Therefore, even when an extra space is not found at the outside of the plane area, the connection between the memory module 230 and the upper contacts and the lower contacts 207b can be realized by rotating the cover 206. Also, since the cover 206 is foldable into two, even when a sufficient space is not found over the connector 230, the cover 206 can be moved to realize the connection between the memory module 230 and the upper contacts and the lower contacts 207b.

Figure 26:
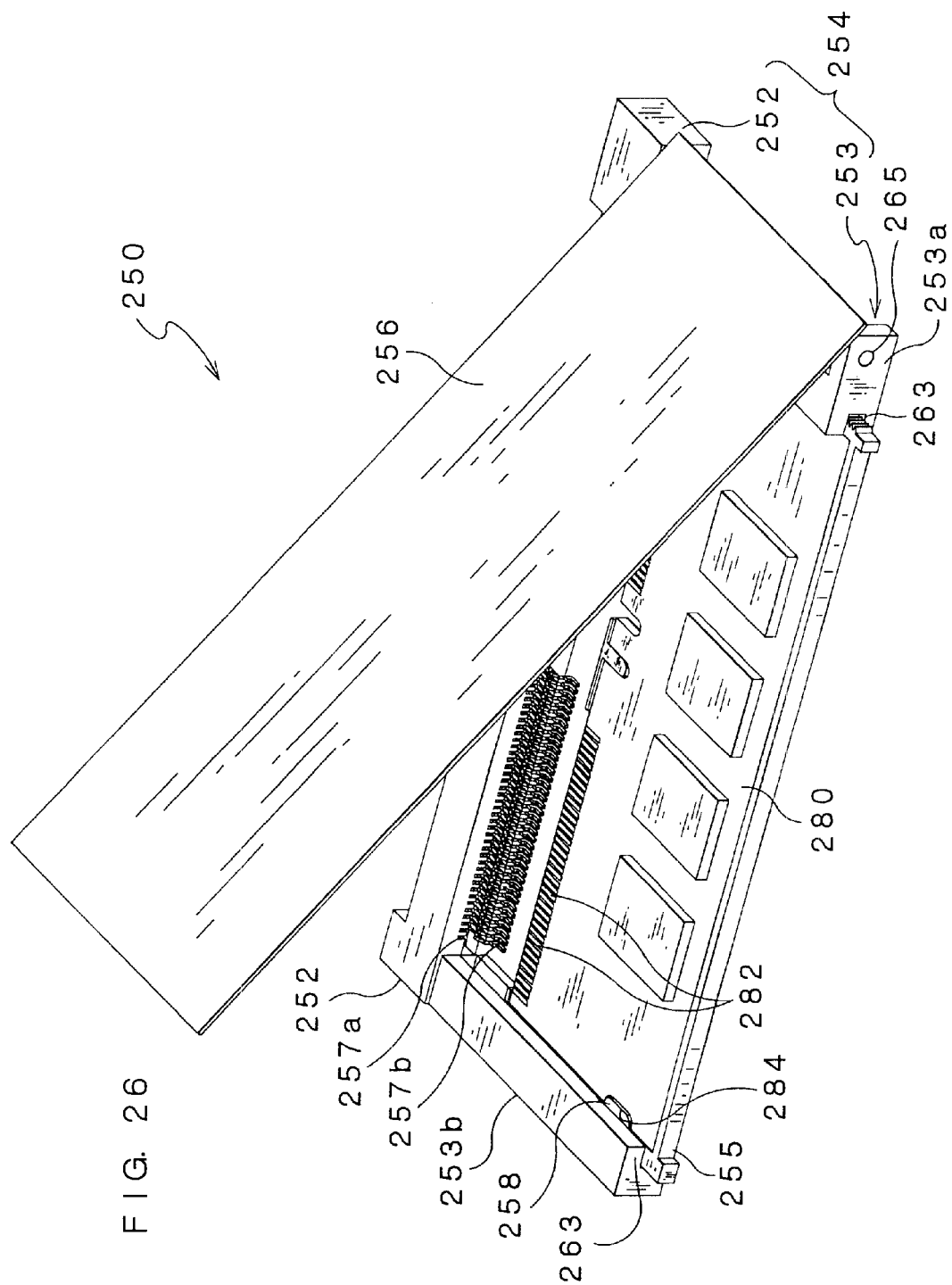
FIG. 26 is a perspective view of a connector according to the seventh embodiment of the invention which is to be loaded with the memory module for the notebook-size personal computer, showing the state of the cover being opened.
Figure 27:
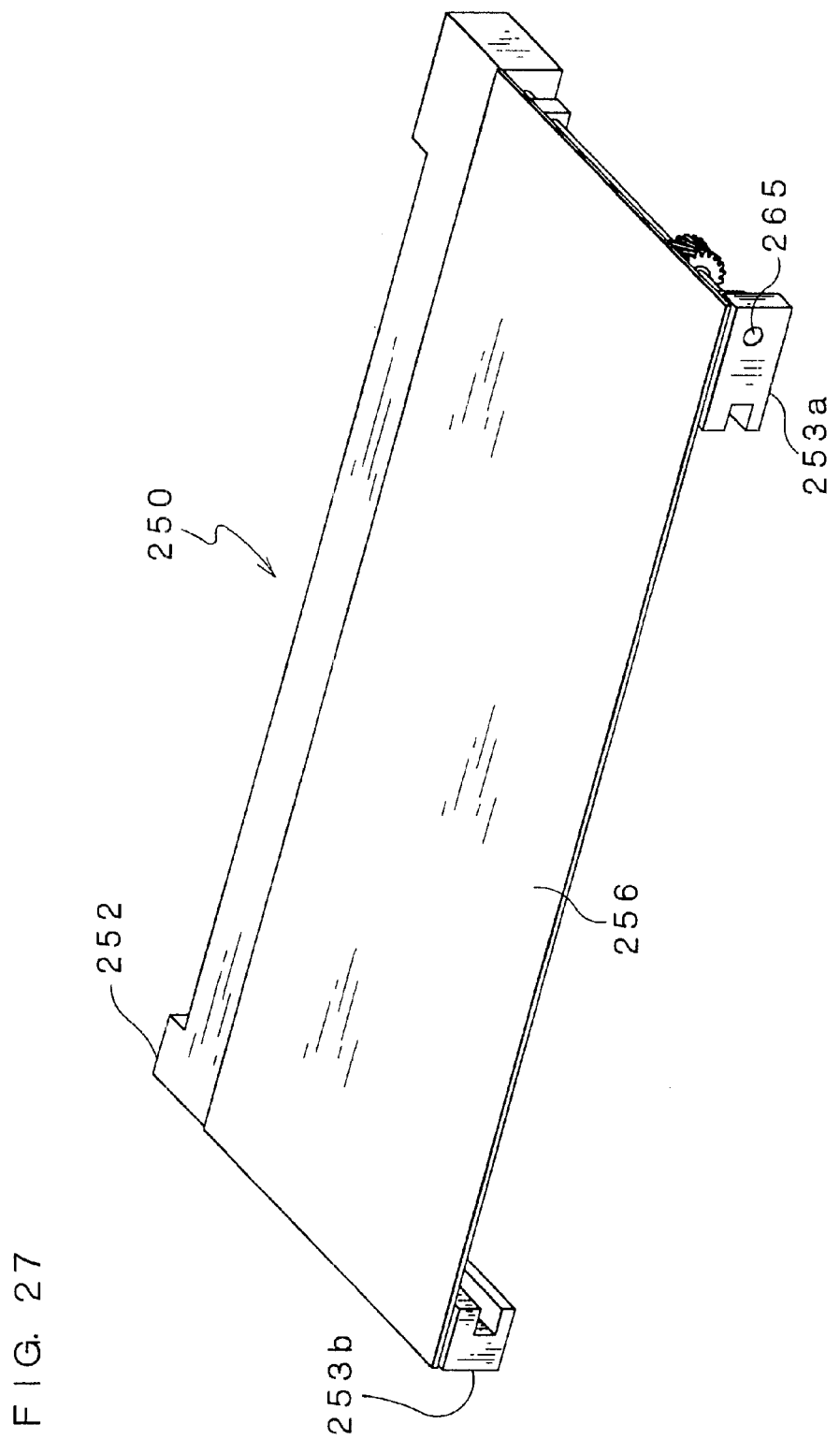
FIG. 27 is a perspective view of the connector of FIG. 26, showing the state of the cover being closed.
Figure 28:
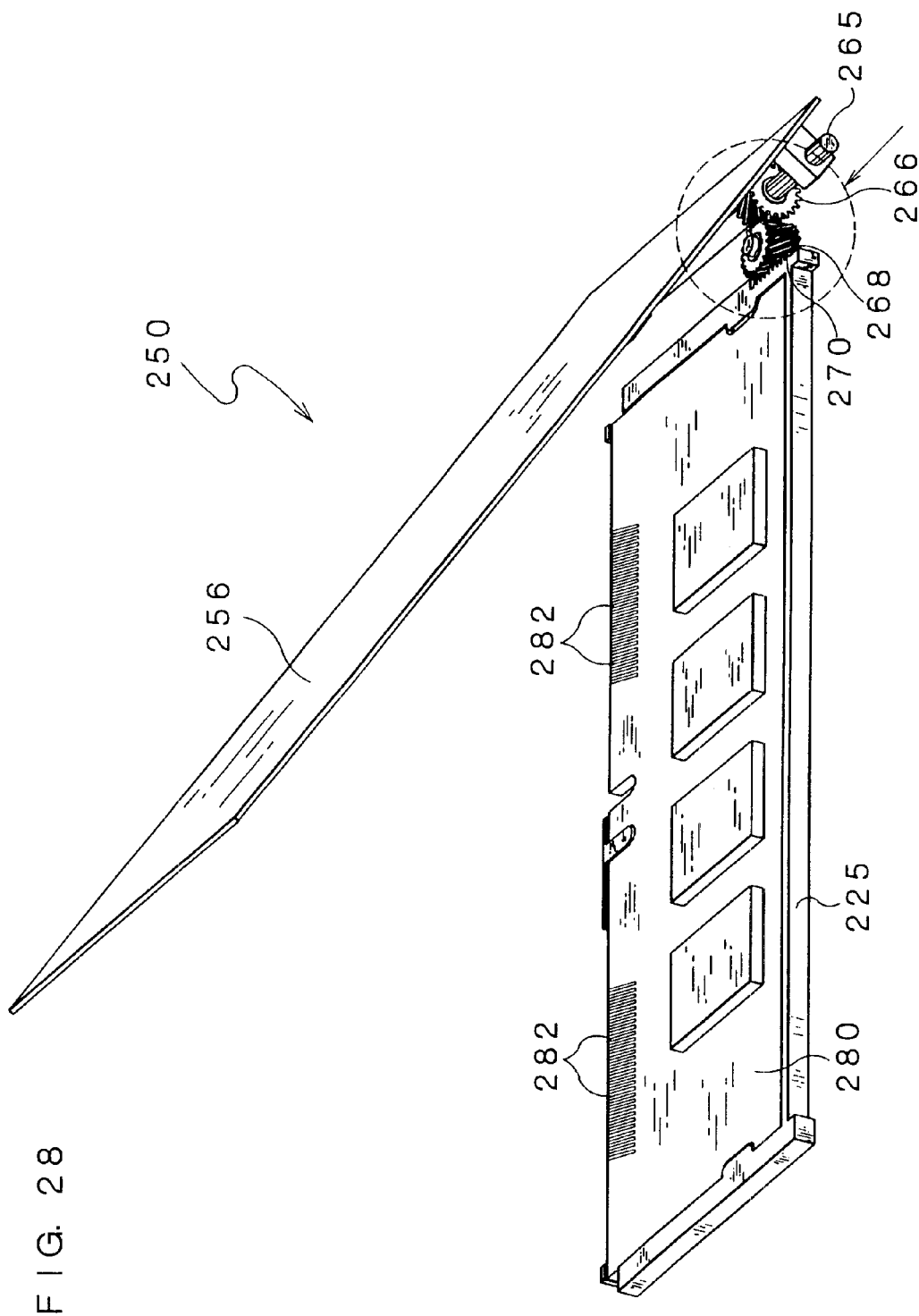
FIG. 28 is a perspective view of the connector of FIG. 26 from which the main body is omitted, as viewed from a different direction from in FIG. 26.
Figure 29:
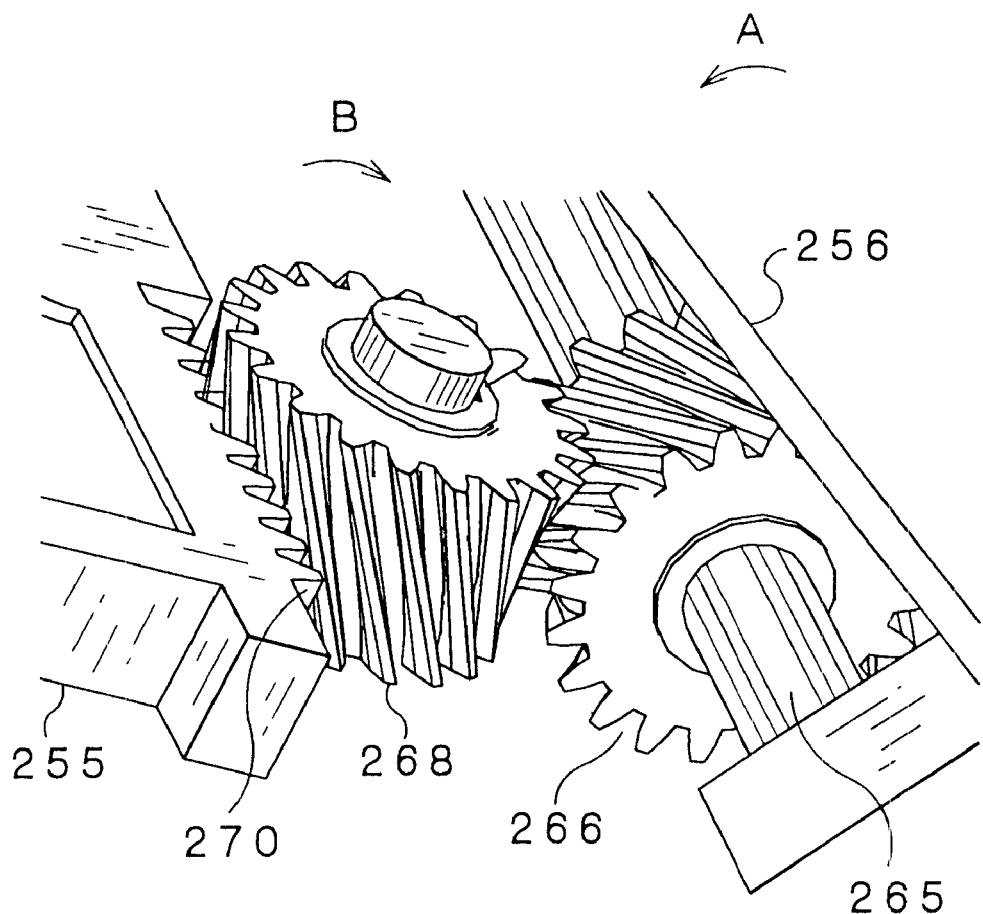
FIG. 29 is an enlarged view of the part encircled by a broken line in FIG. 28.

Next, a connector according to the seventh embodiment of the invention which is to be loaded with the memory module for the notebook-size personal computer will be described with reference to FIGS. 26–29. FIG. 26 is a perspective view of the connector with the cover opened of this embodiment, showing the state of the memory module being supported by a slider. FIG. 27 is a perspective view of the connector with the cover closed of this embodiment. FIG. 28 is a perspective view of the connector of this embodiment from which the main body is omitted, as viewed from a different direction from in FIG. 26. FIG. 29 is an enlarged view of the part encircled by a broken line in FIG. 28.

The connector 250 of this embodiment has a main body 254 comprising a housing 252 and a base 253, a slider 255 mounted on the base 253 in such a manner as to be reciprocally slidable away from and toward the housing 252, and a cover 256 rotatably mounted on the base 253.

As shown in FIG. 26, the base 253 is composed of two spaced apart arms 253a, 253b. The housing 252 is connected with the two arms 253a, 253b at the ends thereof Each of the arms 253a, 253b has in its inside surface a slot 263 extending along the extending direction of the arms 253a, 253b, and end portions of the slider 255 are inserted in the slots 263. The slider 255 is provided with projections 258 which are engageable with cutouts 284 at the ends of the memory module 280 so that the memory module 280 can be detachably supported by the slider 255. It is to be noted that as the memory module 280 is identical in structure to that as illustrated in the first embodiment, except that the cutouts 284 are provided but no holes are provided, the description thereon will be omitted herein. Similarly to the upper contacts 7a and the lower contacts 7b as illustrated in FIG. 4, upper contacts 257a and lower contacts 257b are arranged in the housing 252.

As shown in FIG. 26, a shaft 265 extending along an extending direction of the arm 253a is provided between the one arm 253a of the base 253 and the housing 252. The cover 256 is supported by the shaft 265 at one end portion thereof so that it can rotate around the shaft 265. When the cover 256 is closed, the other end portion of the cover 256 is placed on the arm 253b.

As shown in FIGS. 28 and 29, a pinion 266 is mounted on the shaft 265. The slider 255 is provided, at a side thereof opposite to the arm 252a of the slider 255, with a rack 270. A pinion 268 is supported on the arm 253a so that it can engage with both of the pinion 266 and the rack 270. Each pinion 266, 268 is in the form of a worm gear having obliquely twisted teeth. When the pinion 266 rotates in the direction of an arrow A in FIG. 29, the pinion 268 is rotated in the direction of an arrow B. When the pinion 266 rotates in the direction opposite to the direction of the arrow A, the pinion 268 is rotated in the direction opposite to the direction of the arrow B.

Thus, when the cover 256 is closed and the pinion 266 is rotated in the direction of the arrow A in association with the rotation of the shaft 265, the pinion 268 is rotated in the direction of the arrow B and, as a result of this, the slider 255 having the rack 270 is moved toward the housing 252. When the cover 256 is opened and the pinion 266 is rotated in the direction opposite to the direction of the arrow A in association with the rotation of the shaft 265, the pinion 268 is rotated in the direction opposite to the direction of the arrow B and, as a result, the slider 255 having the rack 270 is moved away from the housing 252. In short, the slider 255 is moved reciprocally with respect to the housing 252 in association with the open and close of the cover 256.

When the memory module 280 is loaded to the connector 250 of this embodiment, the memory module 280 is supported on the slider 255, with the cover 256 opened, as shown in FIG. 26, and then the cover 256 is closed to let the slider 255 move toward the housing 252. Then, the memory module 280 supported by the slider 255 is inserted into the housing 252, so that the conductive pads 282 of the memory module 280 are brought into contact with the upper contacts 257a and the lower contacts 257b. Then, the cover 256 is closed, as shown in FIG. 27, and thereby the loading of the memory module 280 to the connector 250 is completed.

When the memory module 280 is unloaded from the connector 250, the cover 256 is opened from the state of FIG. 27. Then, the slider 255 is moved away from the housing 252 and, as a result, the conductive pads 282 of the memory module 280 are put into the state in which they are not in contact with the upper contacts 257a and the lower contacts 257b. In this state, the memory module 280 can be unloaded from the connector 250 by simply picking up the memory module 280.

Thus, according to the connector 250 of this embodiment, a simple gear mechanism comprising the rack 270 and pinions 268, 270 is used to permit the memory module 280 supported by the slider 255 to be moved reciprocally with respect to the housing 252 in association with the rotation of the cover 256, to selectively switch between the connected mode and the non-connected mode of the memory module 280. Then, the loading of the memory module 280 to the connector 250 only requires two steps that the memory module 280 is supported on the slider 255 and then the cover 256 is closed and entails no troublesome manipulation. The same applies to the unloading of the memory module 280 from the connector 250 as well. Also, since no elastic members such as coil springs are used, no such a troublesome work that the memory module 280 is pressed in against elasticity of the coil springs is necessary, thus providing the advantage of simplifying the structure of device. In addition, when the cover 256 is closed, the whole area of the memory module 280 is covered with the cover 256, as shown in FIG. 27, thus providing the effect of protecting and shielding the memory module from dust, as is the case with the first embodiment.

Also, according to the connector 250 of this embodiment, since the cover 256 rotates around the shaft 265 extending substantially in parallel to the bearing surface for the memory module 280, the cover 256 does not protrude outside of a plane area defined by the cover 256 when the cover 256 is closed. Therefore, even when an extra space is not found at the outside of the plane area, the connection between the memory module 280 and the upper and lower contacts 257a, 257b can be realized by rotating the cover 256.

While there have been shown herein and described certain preferred embodiments of the invention, various design changes and modification may be made within the scope of the claimed invention without limiting to the illustrated embodiments. For example, the connector to be loaded with the button battery may be so modified as to adopt the construction as illustrated in the 2nd or the 4–7th embodiments. Also, while the operating member is formed by the flat cover in all the illustrated embodiments, the operating member may be formed by a lever of a rod.

What is claimed is:

1. A connector for electrically connecting a connection object and a terminal, said connector comprising:
   a main body;
   a terminal, disposed in said main body, to be electrically connected with said connection object;
   an operating member formed by a conductive member and hinged to said main body,
   wherein a substantially whole area of said connection object is covered with said conductive operating member when said connection object is connected with said terminal, said conductive operating member providing electromagnetic shielding of said connection object; and
   a supporting member that permits said connection object to be detachably supported and is movable reciprocally relative to said terminal in association with movement of said operating member by being connected to said operating member through an elliptical hole.

2. A connector according to claim 1, wherein said operating member is rotatable around a shaft extending substantially in parallel to a bearing surface of said supporting member for said connection object.

3. A connector according to claim 2, wherein said supporting member and said operating member are rotatably connected with each other at a position shifted from said shaft,
   said supporting member being moved reciprocally with respect to said terminal in association with a rotation of said operating member.

4. A connector for electrically connecting a connection object and a terminal, said connector comprising:
   a main body;
   a terminal, disposed in said main body, to be electrically connected with said connection object;
   an operating member formed by a conductive member and arranged in association with said main body,
   wherein a substantially whole area of said connection object is covered with said conductive operating member when said connection object is connected with said terminal, said conductive operating member providing electromagnetic shielding of said connection object; and
   a supporting member that permits said connection object to be detachably supported and is movable reciprocally relative to said terminal in association with movement of said operating member,
   wherein said supporting member and said operating member are connected through a gear mechanism,
   wherein said supporting member is moved reciprocally with respect to said terminal in association with a rotation of said operating member.

5. A connector according to claim 1, wherein said terminal is arranged at one end side of said main body and said shaft is provided at an opposing end side of said main body.

6. A connector according to claim 1, wherein said operating member is movable in a traveling direction of said supporting member.

7. A connector for electrically connecting a connection object and a terminal, said connector comprising:
   a main body;
   a terminal, disposed in said main body, to be electrically connected with said connection object;
   an operating member formed by a conductive member and arranged in association with said main body,
   wherein a substantially whole area of said connection object is covered with said conductive operating member when said connection object is connected with said terminal, said conductive operating member providing electromagnetic shielding of said connection object; and
   a supporting member that permits said connection object to be detachably supported and is movable reciprocally relative to said terminal in association with movement of said operating member,
   wherein said operating member is rotatable around a shaft extending substantially vertically to a bearing surface of said supporting member,
   wherein said supporting member is connected with said shaft through a gear mechanism
   said supporting member being moved reciprocally with respect to said terminal in association with a rotation of said operating member.

8. A connector for electrically connecting a connection object and a terminal, said connector comprising:
   a main body;
   terminal, disposed in said main body, to be electrically connected with said connection object;
   an operating member formed by a conductive member and arranged in association with said main body,
   wherein a substantially whole area of said connection object is covered with said conductive operating member when said connection object is connected with said terminal, said conductive operating member providing electromagnetic shielding of said connection object; and
   a supporting member that permits said connection object to be detachably supported and is movable reciprocally relative to said terminal in association with movement of said operating member,
   wherein said operating member moves substantially in parallel to a traveling direction of said supporting member,
   wherein different parts of said supporting member are pressed by said operating member depending on whether said connection object is moved toward said terminal or away therefrom,
   said supporting member being moved reciprocally with respect to said terminal in association with a movement of said operating member.

9. A connector for electrically connecting a connection object and a terminal, said connector comprising:
   a main body;

a terminal, disposed in said main body, to be electrically connected with said connection object;

an operating member formed by a conductive member and arranged in association with said main body, wherein a substantially whole area of said connection object is covered with said conductive operating member when said connection object is connected with said terminal, said conductive operating member providing electromagnetic shielding of said connection object; and a supporting member that permits said connection object to be detachably supported and is movable reciprocally relative to said terminal in association with movement of said operating member, wherein two end portions of said operating member are rotatably supported by a fixed shaft extending substantially in parallel to a bearing surface of said supporting member for said connection object, and by a movable shaft movable in parallel to said fixed shaft, respectively, said operating member being foldable into two parts around an axis extending in parallel to said fixed shaft, said supporting member and said operating being connected through a gear mechanism, and said supporting member being moved reciprocally with respect to said terminal in association with a rotation of said operating member around said fixed shaft.

10. A connector according to claim 1, wherein an electricity storage means is connected in parallel with said connection object when said connection object and said terminal are connected.

11. A connector for electrically connecting a connection object and a terminal, said connector comprising:

a main body;

a terminal, disposed in said main body and electrically connected with said connection object;

an operating member arranged in association with said main body; and a supporting member that permits said connection object to be detachably supported and is movable reciprocally relative to said terminal in association with movement of said operating member, wherein two end portions of said operating member are each rotatably supported by a fixed shaft extending in a direction which is substantially parallel to a bearing surface of said supporting member for said connection object and by a movable shaft movable in parallel to said fixed shaft, respectively, said operating member being foldable into two parts around an axis extending in parallel to said fixed shaft, said supporting member and said operating member being connected through a gear mechanism, and said supporting member being moved reciprocally with respect to said terminal in association with the rotation of said operating member around said fixed shaft.

* * * * *